(12) United States Patent
Hirasawa et al.

(10) Patent No.: US 10,106,336 B2
(45) Date of Patent: Oct. 23, 2018

(54) TRANSPORT SYSTEM

(71) Applicant: HIRATA CORPORATION, Shinagawa-ku, Tokyo (JP)

(72) Inventors: Yoichi Hirasawa, Tokyo (JP); Masaki Sotome, Tokyo (JP); Kazuhiro Arai, Tokyo (JP)

(73) Assignee: HIRATA CORPORATION, Shinagawa-Ku, Tokyo (JP)

( * ) Notice: Subject to any disclaimer, the term of this patent is extended or adjusted under 35 U.S.C. 154(b) by 420 days.

(21) Appl. No.: 14/748,834

(22) Filed: Jun. 24, 2015

(65) Prior Publication Data
US 2015/0291371 A1 Oct. 15, 2015

Related U.S. Application Data

(63) Continuation of application No. PCT/JP2012/008266, filed on Dec. 25, 2012.

(51) Int. Cl.
*B65G 49/00* (2006.01)
*G06K 9/00* (2006.01)
(Continued)

(52) U.S. Cl.
CPC .............. *B65G 49/00* (2013.01); *B25J 9/023* (2013.01); *B25J 15/0616* (2013.01);
(Continued)

(58) Field of Classification Search
CPC .... B65G 49/00; B65G 37/00; G01R 31/2893; H01L 21/67706; H01L 21/681;
(Continued)

(56) References Cited

U.S. PATENT DOCUMENTS 4,868,974 A  9/1989  Nishiguchi
7,987,968 B2  8/2011  Kobayashi et al.
(Continued)

FOREIGN PATENT DOCUMENTS

CN  1733579 A  2/2006
CN  1968876 A  5/2007
(Continued)

OTHER PUBLICATIONS

Office Action dated Mar. 24, 2017, by the Chinese Patent Office in corresponding Chinese Patent Application No. 201280077980.4 and partial English translation of the Office Action. (19 pages).

(Continued)

*Primary Examiner* — Thai Q Tran
*Assistant Examiner* — Nien Yang
(74) *Attorney, Agent, or Firm* — Buchanan Ingersoll & Rooney PC

(57) ABSTRACT

The present invention provides a system that transports a tray in a horizontal attitude, the tray including a plurality of work placement portions arranged in a matrix. The system includes first and second transport units, a transfer device transferring the tray between the first transport unit and the second transport unit, a shooting unit including a line sensor shooting, between the first transport unit and the second transport unit, an image of the tray transferred by the transfer device and a moving device moving the transfer device and the shooting unit in a direction to traverse a plurality of transport lines of the first transport unit.

12 Claims, 19 Drawing Sheets

(51) Int. Cl.
   *G06T 7/00* (2017.01)
   *B65G 37/00* (2006.01)
   *G01R 31/28* (2006.01)
   *H01L 21/677* (2006.01)
   *H01L 21/68* (2006.01)
   *B25J 19/02* (2006.01)
   *B25J 9/02* (2006.01)
   *B25J 15/06* (2006.01)

(52) U.S. Cl.
   CPC ............ *B25J 19/023* (2013.01); *B65G 37/00* (2013.01); *G01R 31/2893* (2013.01); *G06K 9/00624* (2013.01); *H01L 21/67706* (2013.01); *H01L 21/681* (2013.01); *G06K 2209/19* (2013.01); *G06T 2207/20221* (2013.01); *G06T 2207/30164* (2013.01)

(58) Field of Classification Search
   CPC ...... B25J 19/023; B25J 9/023; B25J 15/0616; G06K 2209/19; G06K 9/00624; G06T 2207/20221; G06T 7/0042; G06T 2207/30164
   USPC .......................................................... 348/91
   See application file for complete search history.

(56) References Cited

U.S. PATENT DOCUMENTS

| | | | |
|---|---|---|---|
| 8,011,871 | B2 | 9/2011 | Lehrieder et al. |
| 8,365,385 | B2* | 2/2013 | Ikushima ................ B23Q 1/66 222/146.1 |
| 8,499,924 | B2 | 8/2013 | Kobayashi et al. |
| 8,882,437 | B2 | 11/2014 | Nakanishi |
| 2002/0024659 | A1* | 2/2002 | Tanaka .................. G01N 21/94 356/237.2 |
| 2006/0072988 | A1 | 4/2006 | Hariki et al. |
| 2007/0159532 | A1* | 7/2007 | Kiyokawa ............. G01M 11/00 348/187 |
| 2007/0227858 | A1* | 10/2007 | Aoyama ........... A61F 13/15764 198/612 |
| 2010/0106297 | A1 | 4/2010 | Inazumi et al. |
| 2012/0098961 | A1 | 4/2012 | Handa et al. |

FOREIGN PATENT DOCUMENTS

| | | |
|---|---|---|
| CN | 101023009 A | 8/2007 |
| CN | 101321604 A | 12/2008 |
| CN | 101643148 A | 2/2010 |
| CN | 101726722 A | 6/2010 |
| CN | 102528810 A | 7/2012 |
| EP | 2 541 592 A1 | 1/2013 |
| JP | 7-120530 A | 5/1995 |
| JP | H07-215454 A | 8/1995 |
| JP | 2003-270295 A | 9/2003 |
| JP | 2008-260075 A | 10/2008 |
| JP | 2011-232275 A | 11/2011 |
| KR | 10-0805228 B1 | 2/2008 |
| TW | 201139248 A | 11/2011 |
| TW | I359777 B1 | 3/2012 |
| WO | WO 2009/144790 A1 | 12/2009 |

OTHER PUBLICATIONS

Office Action (Notice of Non-Final Rejection) dated Aug. 4, 2016, by the Korean Patent Office in corresponding Korean Patent Application No. 10-2015-7014906, and a partial English translation of the Office Action. (7 pages).

Office Action dated Aug. 18, 2016, by the State Intellectual Property Office of China in corresponding Chinese Patent Application No. 201280077980.4. (9 pages).

International Search Report (PCT/ISA/210) dated Feb. 12, 2013, by the Japanese Patent Office as the International Searching Authority for International Application No. PCT/JP2012/008266.

Written Opinion (PCT/ISA/237) dated Feb. 12, 2013, by the Japanese Patent Office as the International Searching Authority for International Application No. PCT/JP2012/008266.

* cited by examiner

TRANSPORT SYSTEM

This application is a continuation of International Patent Application No. PCT/JP2012/008266 filed on Dec. 25, 2012, the entire content of which is incorporated herein by reference.

BACKGROUND OF THE INVENTION

Field of the Invention

The present invention relates to a transport system for transporting works.

Description of the Related Art

As a transport form for a small work represented by an electronic component, there is known a transport form that places a plurality of works on a tray and transports them at once. In a system that employs such a transport form, a process for works is performed by, for example, extracting the works from the tray one by one. After the process, each work is returned to its original position or placed on another tray as a processed work. Such a system often needs to manage the relationship between a work and a position on the tray or the presence/absence of a work at each placement position on the tray. To do this, there is proposed a system that shoots a tray and specifies the placement state of a work from image data. For example, Japanese Patent Laid-Open No. 7-120530 discloses a system that employs a camera capable of shooting a whole tray at once in a specific area. Japanese Patent Laid-Open No. 2011-232275 discloses a system that shoots a tray by a shooting apparatus provided for each tray transport line.

In a system that provides a dedicated area to shoot a tray, performs shooting by a shooting apparatus arranged in the dedicated area, and then performs a predetermined process, like the system of Japanese Patent Laid-Open No. 7-120530, it is necessary to transport the tray to the dedicated area for tray shooting, shoot the tray after completion of transport, and perform the predetermined process after completion of shooting. This may lower the transport efficiency until the start of the process. In addition, the shooting apparatus is relatively expensive in many cases. In a system that provides a shooting apparatus for each tray transport line, like the system of Japanese Patent Laid-Open No. 2011-232275, the number of shooting apparatuses increases, resulting in an increase in cost.

SUMMARY OF THE INVENTION

It is an object of the present invention to enable shooting of a tray while suppressing a decrease in transport efficiency or an increase in cost.

According to an aspect of the present invention, there is provided a transport system that transports a tray in a horizontal attitude, the tray including a plurality of work placement portions arranged in a matrix on which works are placed, the system comprising: a first transport unit including a plurality of transport lines, each transport line being configured to transport the tray; a second transport unit including at least one transport line configured to transport the tray from the first transport unit; a transfer device configured to transfer, between the first transport unit and the second transport unit, the tray from the transport line of the first transport unit to the transport line of the second transport unit; a shooting unit including a line sensor configured to shoot, between the first transport unit and the second transport unit, an image of the tray in a direction perpendicular to a moving direction of the tray which is transferred by the transfer device; and a moving device configured to move the transfer device and the shooting unit in a direction to traverse the plurality of transport lines of the first transport unit.

Further features of the present invention will become apparent from the following description of exemplary embodiments (with reference to the attached drawings).

DESCRIPTION OF THE EMBODIMENTS

<Outline of System>

Figure 1:
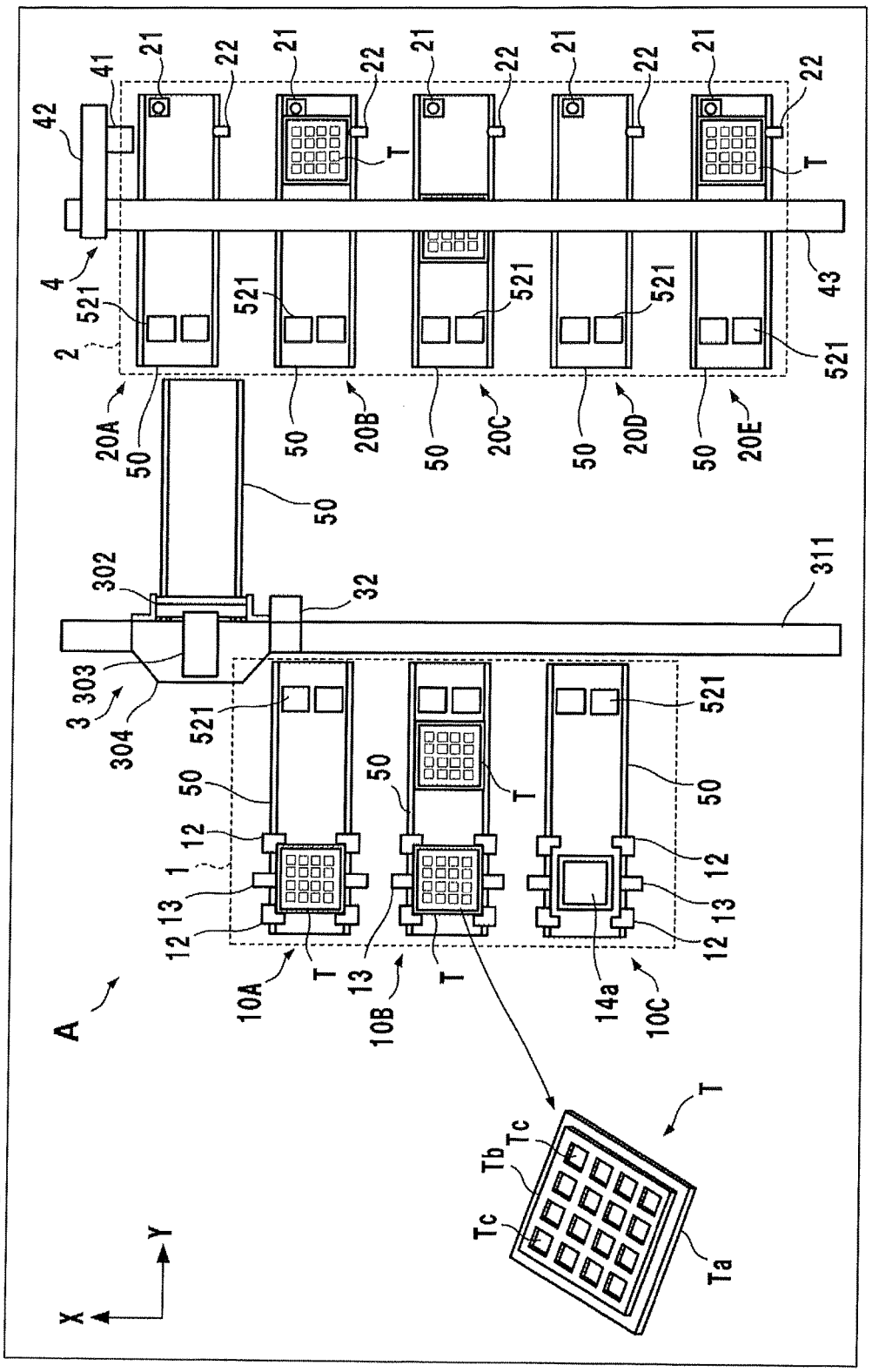
FIG. 1 shows the layout of a transport system according to an embodiment of the present invention and a perspective view of a tray.

An embodiment of the present invention will now be described with reference to the accompanying drawings. In the drawings, X and Y represent horizontal directions that are the first and second directions perpendicular to each other, and Z represents a vertical direction that is the third direction perpendicular to the horizontal directions. FIG. 1 shows the layout of a transport system A according to an embodiment of the present invention and a perspective view of a tray T.

The tray T is a member to place a work. In this embodiment, the work is placed on the tray T and transported in this state. In this embodiment, the tray T has a square plate shape as a whole, and integrally includes a square base plate portion Ta and a square stage portion Tb one step higher than the base plate portion Ta. A plurality of work placement portions Tc to place works are arranged on the upper surface of the stage portion Tb so as to form a matrix in the horizontal direction. In this embodiment, each work placement portion Tc is a square concave portion, and a total 4×4=16 work placement portions Tc are provided.

The transport system A includes a first transport unit 1, a second transport unit 2, a transfer unit 3, and a work replacement unit 4, and transports the tray T in a horizontal attitude. In this embodiment, the tray T is first supplied to the first transport unit 1 by an apparatus or worker (not shown) and then transferred from the first transport unit 1 to the second transport unit 2 by the transfer unit 3. The work replacement unit 4 moves above the second transport unit 2 in the X direction and, for example, exchanges works between different trays T on the second transport unit 2. After work exchange, the tray T is unloads from the second transport unit 2 by an apparatus or worker (not shown).

The first transport unit 1 includes a plurality of transport apparatuses 10A to 10C (to be generically referred to as a transport apparatus 10 hereinafter). Each transport apparatus 10 forms a transport line to transport the tray T in the horizontal attitude in the Y direction. The transport apparatuses 10 are juxtaposed in the X direction so as to make the transport lines parallel. Note that the number of transport apparatuses 10 (number of transport lines) is three in this embodiment but may be two or four or more.

The second transport unit 2 includes a plurality of transport apparatuses 20A to 20E (to be generically referred to as a transport apparatus 20 hereinafter). Each transport apparatus 20 forms a transport line to transport the tray T in the horizontal attitude in the Y direction. The transport apparatuses 20 are juxtaposed in the X direction so as to make the transport lines parallel. Note that the number of transport apparatuses 20 (number of transport lines) is five in this embodiment, but at least one transport apparatus 20 suffices.

Each of the transport apparatuses 10 and 20 and the transfer unit 3 includes a common basic unit 50. The basic unit 50 is a transport unit that transports the tray T in the horizontal attitude. In this embodiment, the system arrangement is simplified by individually making improvement or adding components while causing the transport apparatuses 10 and 20 and the transfer unit 3 to share the basic unit 50. However, the transport apparatuses 10 and 20 and the transfer unit 3 may include different transport units. The first transport unit 1 (plurality of transport apparatuses 10), the second transport unit 2 (transport apparatuses 20), the transfer unit 3, and the work replacement unit 4 that constitute the transport system A according to this embodiment are placed at predetermined positions of a common platform (not shown) and integrated.

<Basic Unit>

Figure 2:
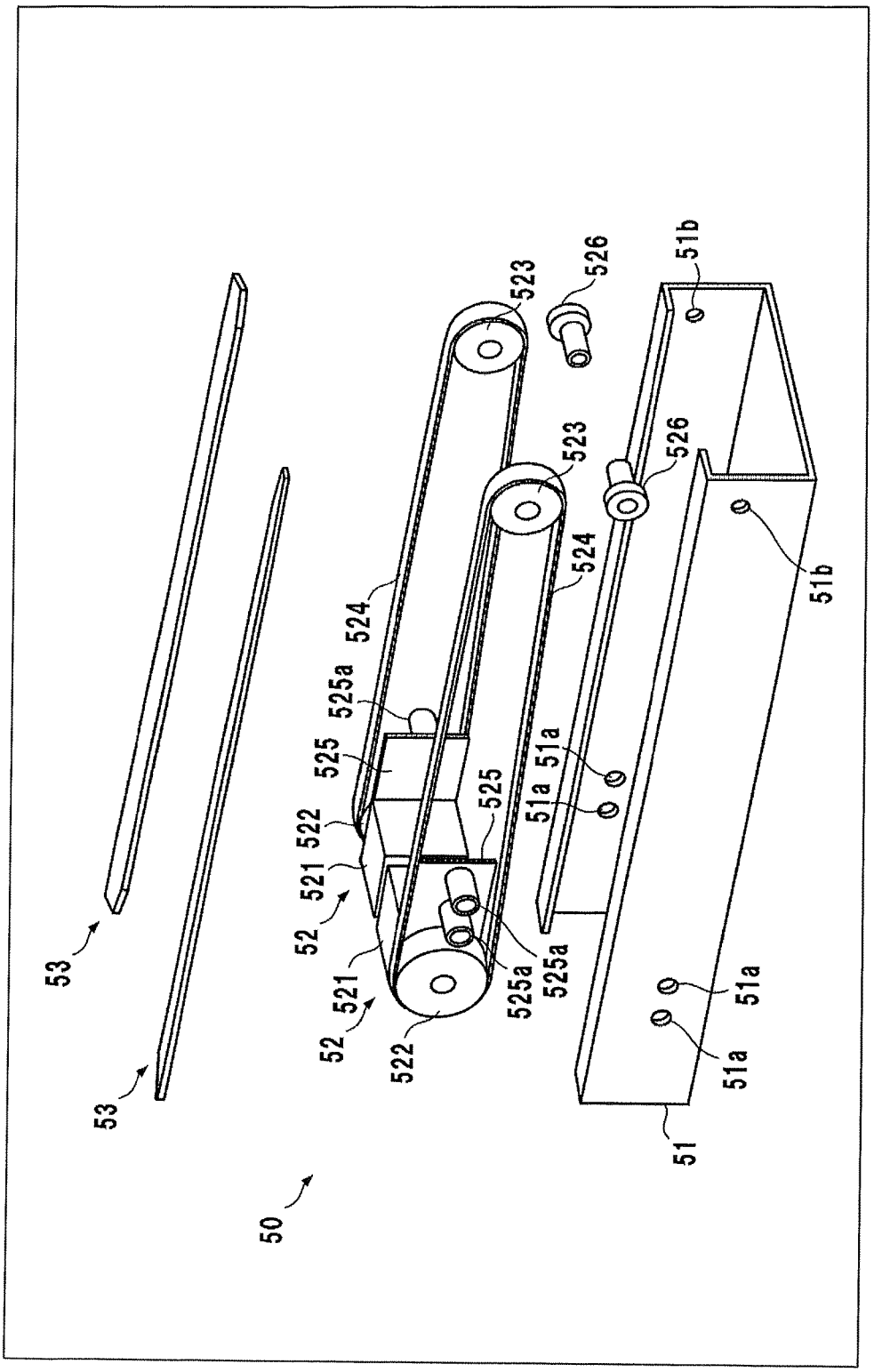
FIG. 2 is an exploded perspective view of a basic unit.

FIG. 2 is an exploded perspective view of the basic unit 50. The basic unit 50 includes a base member 51, transport mechanisms 52, and guide members 53.

The base member 51 includes a bottom wall extending in the transport direction (Y direction) of the tray T, a pair of side walls rising from both sides of the bottom wall, and edge portions projecting from the side walls toward the inside of the base member 51 (toward the opposite side walls). The base member 51 has a C-shaped section with an open topside, and has, as a whole, a troughed shape with two ends open in the Y direction. For this reason, an internal space is formed inside the base member 51. The base member 51 can be a member integrally formed by, for example, bending a metal plate by press working or the like.

The guide members 53 are fixed to the edge portions on the top of the side walls of the base member 51. When transporting the tray T, the guide members 53 guide its movement to prevent meandering. The distance between the inner side surfaces of the guide members 53 is set to be slightly wider than the X-direction width of the base plate portion Ta of the tray T. The guide members 53 guide the side surfaces of the base plate portion Ta, thereby preventing the tray T from meandering.

The transport mechanisms 52 are supported by the inner side walls of the base member 51, respectively, and transport the tray T. In this embodiment, each transport mechanism 52 constitutes a belt transmission mechanism but may form another type of transport mechanism.

Each transport mechanisms 52 includes a driving source 521 such as a motor, a drive pulley 522 that is supported and rotated by the driving source 521, a driven pulley 523, and an endless belt 524 wound on the drive pulley 522 and the driven pulley 523. When the drive pulley 522 rotates, the endless belt 524 travels.

The driving sources 521 are supported by the inner side walls of the base member 51 via support members 525, respectively. Each support member 525 includes attachment portions 525a. Each attachment portion 525a has, for example, a threaded hole. Holes 51a are formed in the side walls of the base member 11. When bolts (not shown) are inserted into the holes 51a and threadably engage with the attachment portions 525a, the support members 525 can be fixed to the side walls of the base member 51.

The driven pulleys 523 are rotatably supported by shaft members 526. Each shaft member 526 has, for example, a threaded hole. Holes 51b are formed in the side walls of the base member 11. When bolts (not shown) are inserted into the holes 51b and threadably engage with the shaft members 526, the shaft members 526 can be fixed to the inner side walls of the base member 51. Note that in this embodiment, the driven pulley 523 has a diameter smaller than that of the drive pulley 522 such that more other components can be disposed on the side of the driven pulleys 523 in the internal space of the base member 51.

With the above-described arrangement, the tray T is placed across the endless belts 524 and transported in the longitudinal direction (Y direction) of the base member 51 as the endless belts 524 travel. The transport direction can be reversed by switching the traveling direction of the endless belts 524.

<Transport Apparatuses>

Figure 3:
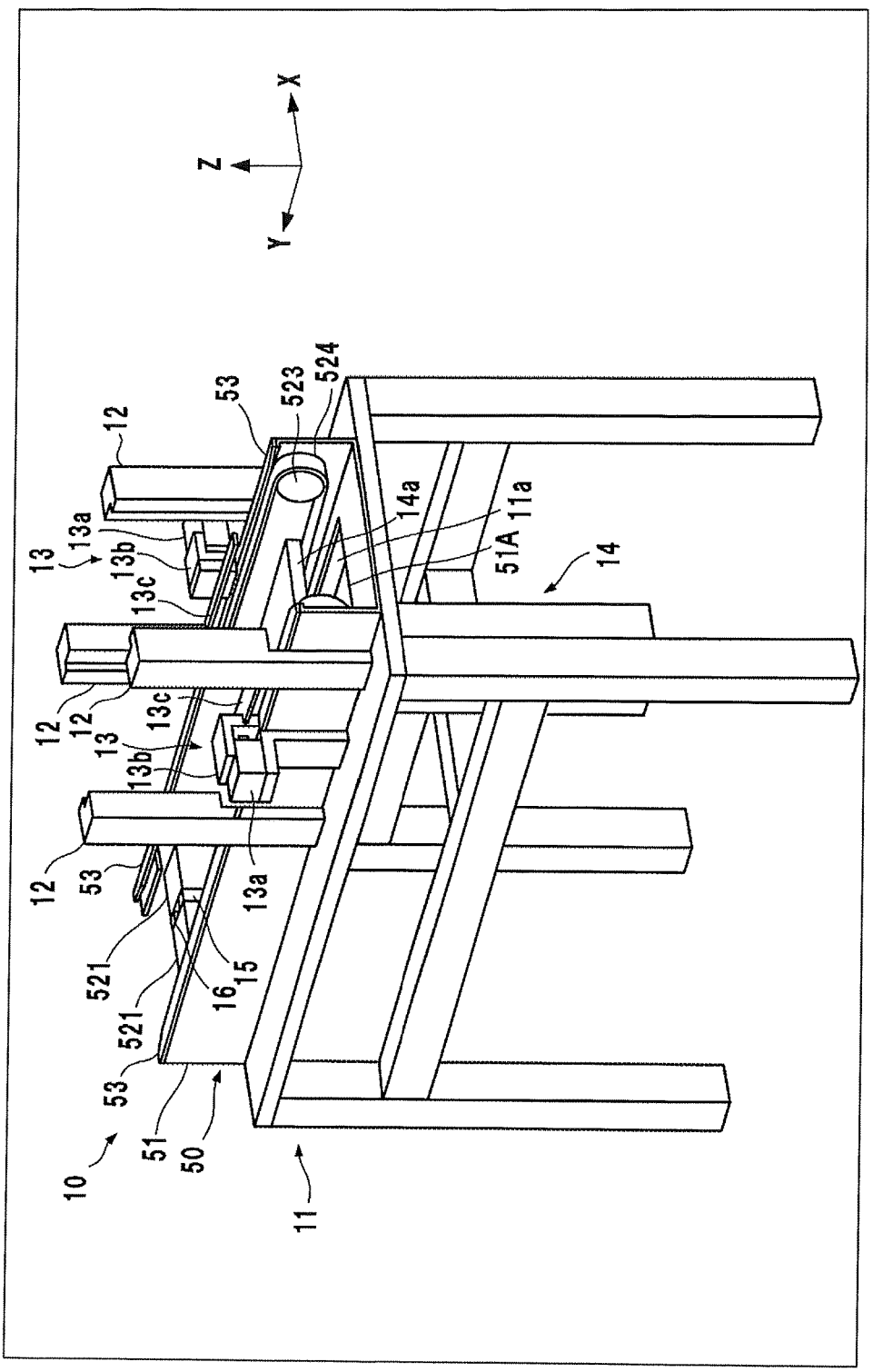
FIG. 3 is a perspective view of a transport apparatus.

The arrangements of the transport apparatuses 10 and 20 will be described next. The transport apparatus 10 will be described first with reference to FIG. 3. FIG. 3 is a perspective view of the transport apparatus 10.

The transport apparatus 10 includes a support table 11 that supports the basic unit 50, four tray guides 12, two tray support units 13, an elevating device 14, and tray detection sensors 15 and 16.

The tray guides 12 are column members configured to support a plurality of trays T in a stacking state. Each tray guide 12 has an L-shaped section and guides a corner of the base plate portion Ta of the tray T in the vertical direction. The trays T are arranged inside the four tray guides 12 in the stacking state.

Each tray support unit 13 includes a driving portion 13a, a movable portion 13b, and a placement plate 13c. The driving portion 13a is an actuator, for example, an electronic cylinder configured to reciprocally move the movable portion 13b in the X direction. The placement plate 13c is fixed to the movable portion 13b, and the outer edge of the base plate portion Ta of the tray T is placed on the placement plate 13c.

The elevating device 14 includes an elevating table 14a and a driving mechanism (for example, electronic cylinder) (not shown) configured to move the elevating table 14a up and down, and is supported by the support table 11. The tray T is placed on the elevating table 14a. An opening portion 11a (see FIG. 4) is formed in the top plate of the support table 11, and an opening portion 51A (see FIG. 4) is formed in the bottom wall of the base member 51 of the basic unit 50. The elevating device 14 can pass through the opening portions 11a and 51A.

The tray detection sensors 15 and 16 are sensors configured to detect the tray T passing above, and are formed from, for example, reflective photosensors. The detection results of the tray detection sensors 15 and 16 are used to control the timing of the shooting operation of the tray T by a shooting unit 30 (to be described later).

Figure 4:
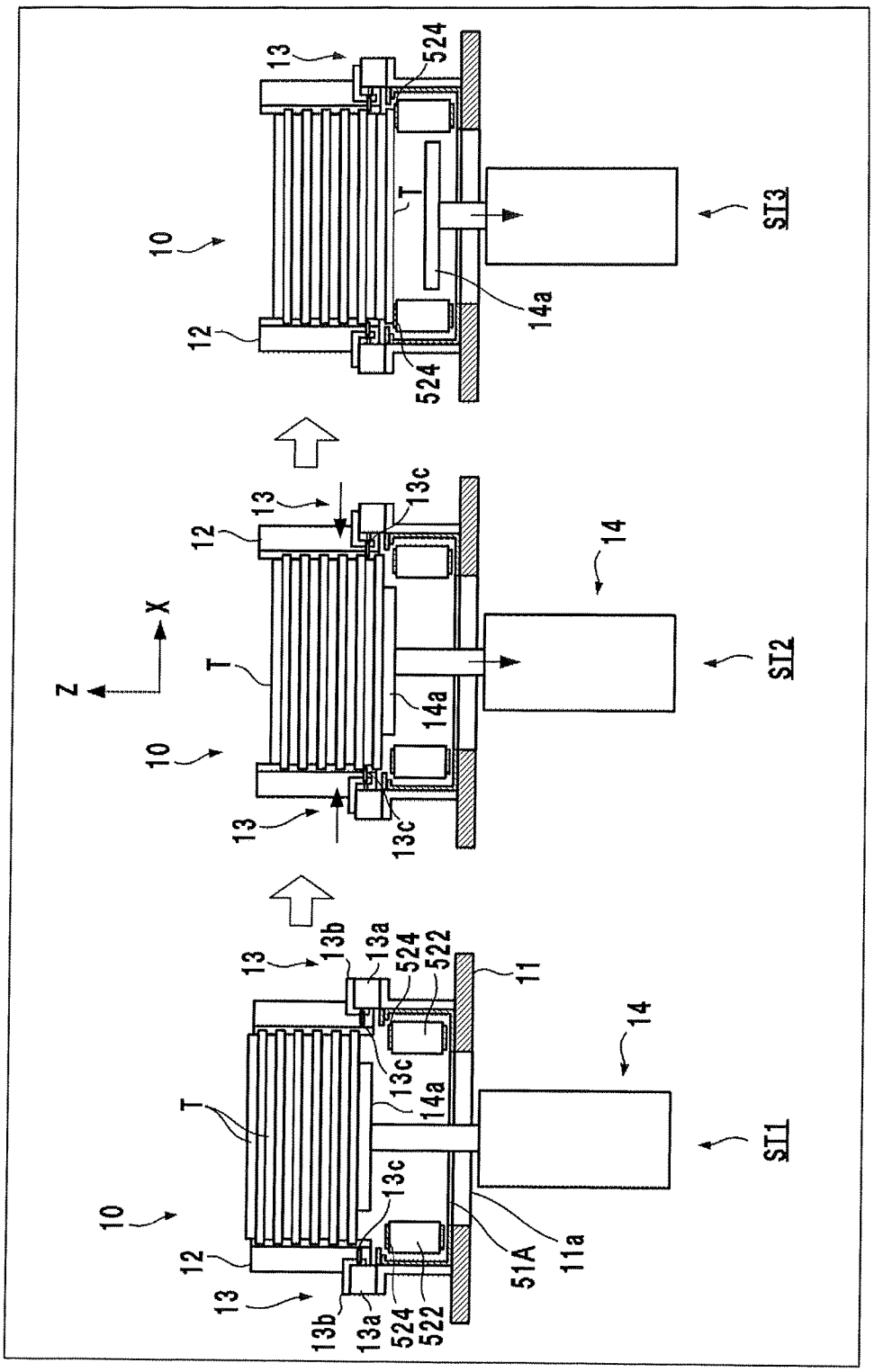
FIG. 4 is an explanatory view of the operation of the transport apparatus shown in FIG. 3.

The operation of the transport apparatus 10 will be described next. FIG. 4 is an explanatory view of the operation of the transport apparatus 10. A state ST1 shows a state in which a plurality of trays T are placed on the elevating table 14a in the stacking state. The elevating table 14a is located at the up position. Each tray T has its four corners vertically guided by the four tray guides 12, and is located inside the four tray guides 12. The movable portions 13b are located at retracting positions where the placement plates 13c are separated from the trays T in the X direction. The transport apparatus 10 has a function (destacking function) of unloading each tray T one by one from the plurality of trays T in the stacking state.

More specifically, the elevating table 14a is moved down to a predetermined height so as to locate the trays T in the stacking state at a position where the placement plates 13c of the tray support units 13 can enter between the lowest tray T and the second lowest tray T. Next, the driving portions 13a are driven to cause the placement plates 13c to enter between the lowest tray T and the second lowest tray T. A state ST2 shows this state.

Then, when the elevating table 14a is further moved down, the lowest tray T moves down, but the remaining trays T remain placed on the placement plates 13c and do not move down. This makes it possible to "destack" (or "extract") only the lowest tray T and place it on the endless belts 524 of the basic unit 50. A state ST3 shows this state. When the endless belts 524 travel, the lowest tray T can be transported.

After that, the process returns to the state ST1 to repeat the same procedure, thereby "destacking" each tray T one by one from the plurality of trays T in the stacking state and unloading it to the transfer unit 3. It is also possible to stack each tray T in accordance with a reverse procedure. That is, when the tray T is transported from the transfer unit 3 to the transport apparatus 10, the transport direction of the basic unit 50 is reversed to locate the tray T on the elevating table 14a. The elevating table 14a is raised to cause the tray support units 13 to support the tray T. The trays T are thus stacked from below, thereby collecting and stacking the trays T.

Figure 5:
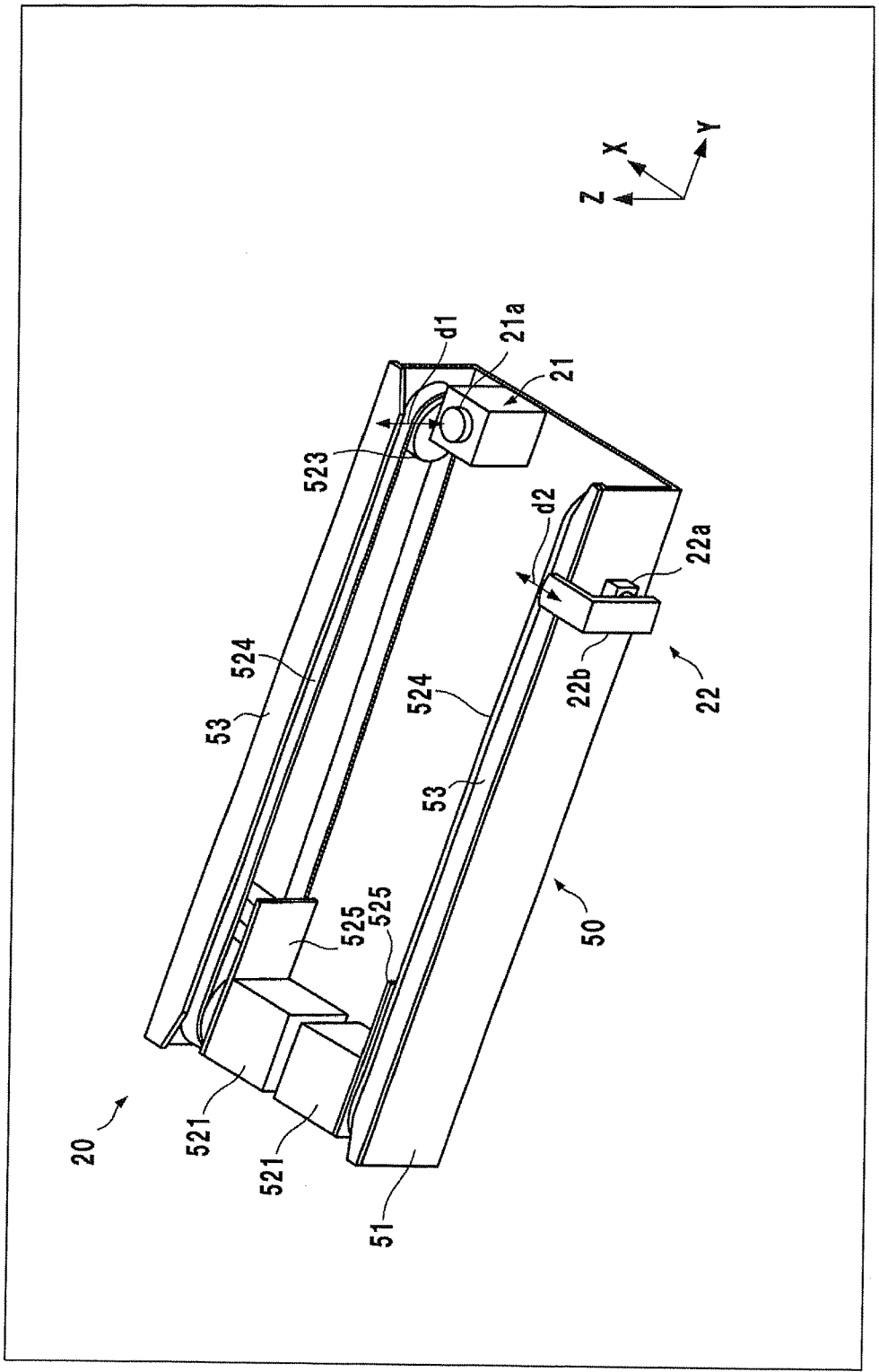
FIG. 5 is a perspective view of the transport apparatus.

The transport apparatus 20 will be described next with reference to FIG. 5. In the transport apparatus 20, the basic unit 50 is provided with positioning mechanisms 21 and 22 that position the tray T in the X and Y directions.

In this embodiment, the positioning mechanism 21 is an actuator, for example, an electronic cylinder configured to reciprocally move an abutting portion 21a in the direction of an arrow d1 (Z direction). To position, the abutting portion 21a is raised to cause the leading edge of the base plate portion Ta of the tray T abut against the outer surface of the abutting portion 21a. This can position the tray T in the Y direction. To unload the tray T, the abutting portion 21a is moved down to cancel abutment to the tray T and allow the tray T to move above the abutting portion 21a.

In this embodiment, the positioning mechanism 22 includes a driving portion 22a and an arm portion 22b. The driving portion 22a is an actuator, for example, an electronic cylinder configured to reciprocally move the arm portion 22b in a direction d2 (X direction). The arm portion 22b can make its end abut against a side surface of the stage portion Tb of the tray T. To position, the arm portion 22b is moved to the side of the tray T in the X direction so that the end abuts against a side surface of the stage portion Tb of the tray T. The tray T is pressed against the guide member 53 on the opposite side, and a side of the base plate portion Ta abuts against the guide member 53. This can position the tray T in the X direction.

As described above, the transport apparatus 20 includes the positioning mechanisms 21 and 22. This makes it possible to position the tray T in the X and Y directions and put it on a halt and standby in this state at one Y-direction end of the transport apparatus 20.

<Transfer Unit>

Figure 6:
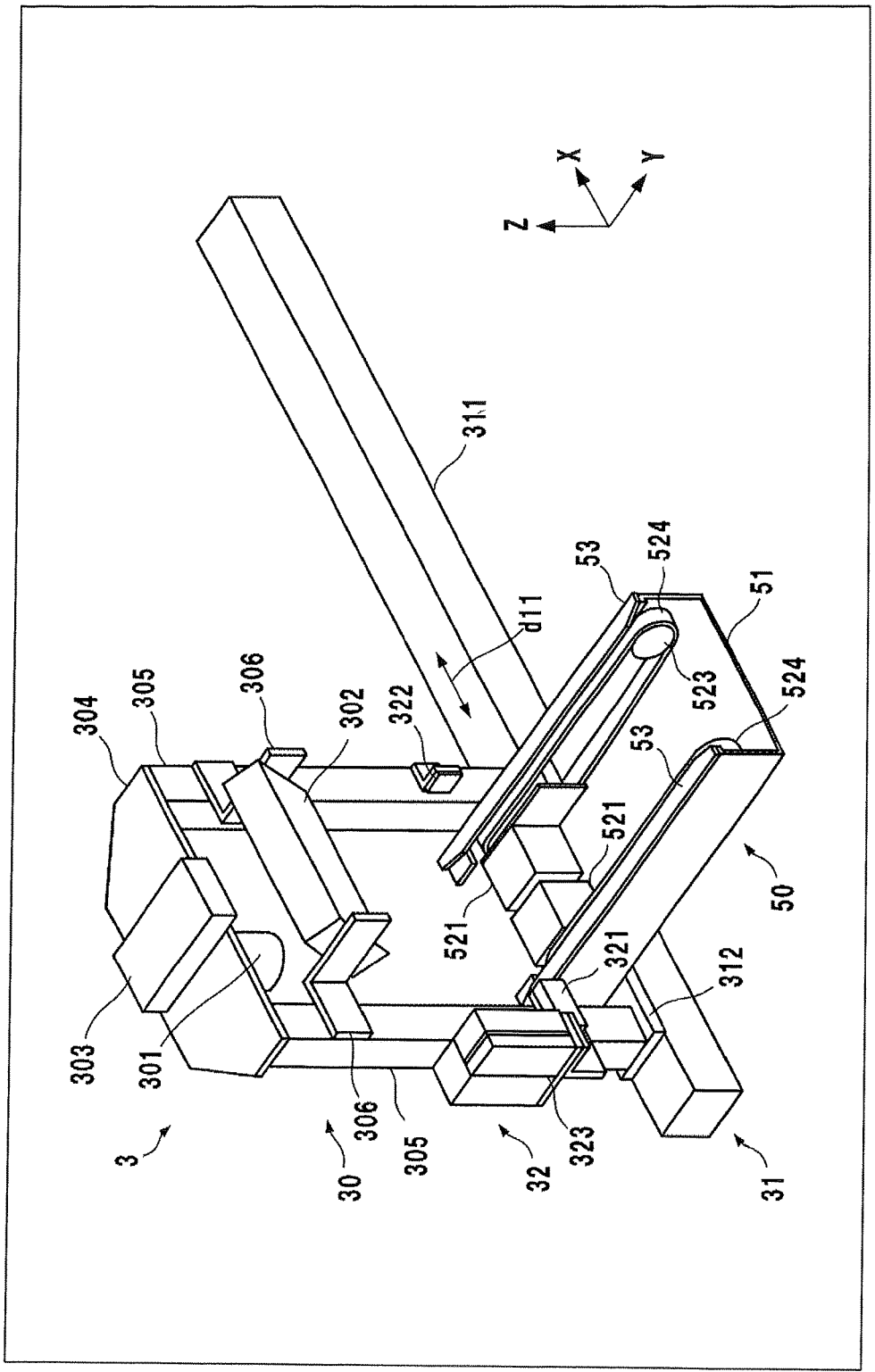
FIG. 6 is a perspective view of a transfer unit.

The arrangement of the transfer unit 3 will be described next with reference to FIG. 6. FIG. 6 is a perspective view of the transfer unit 3. The transfer unit 3 includes the basic unit 50, the shooting unit 30, a moving device 31, and a work detection unit 32.

The basic unit 50 functions as a transfer apparatus. That is, between the first transport unit 1 and the second transport unit 2, the basic unit 50 forms a tray transport line together with the transport line 10 of the first transport unit 1 or the transport line 20 of the second transport unit 2, and transports and transfers the tray T from the transport line 10 of the first transport unit 1 to the transport line 20 of the second transport unit 2.

The shooting unit 30 includes a line sensor 301, an illumination device 302, a shooting control unit 303, and support members 304 to 306 that support these units.

The line sensor 301 is arranged closer to the transport apparatus 10 in the Y direction above the basic unit 50 at the center in the X direction. The line sensor 301 shoots the tray T transferred by the basic unit 50 between the first transport unit 1 and the second transport unit 2. The image sensing element of the line sensor 301 is arranged in a direction (X direction) perpendicular to the moving direction of the tray T. Hence, the shot image is a one-dimensional image long in the X direction.

The illumination device 302 includes a light-emitting element. The illumination device 302 illuminates the tray T to be shot and adjusts brightness in the shooting range of the line sensor 301. The illumination device 302 is attached to and supported by a pair of support members (column members) 305 via the support members 306 (in this embodiment, a pair of support members (brackets) 306). The illumination device 302 is attached to the support members 306 so as to be pivotal about the X-axis to adjust the irradiation direction.

The shooting control unit 303 includes a computer configured to control the shooting operation of the line sensor 301. In this embodiment, the shooting control unit 303 also functions as an image generation unit configured to process the shot image of the line sensor 301 and an information generation unit configured to analyze the shot image and generate information.

The support member 304 forms the top plate of the shooting unit 30. The pair of support members 305 have columnar shapes to support the support member 304. The support member 304 and the pair of support members 305 form a gate shape (arch shape). Between the pair of support members 305, the basic unit 50 is arranged so as to make its transport direction cross. The line sensor 301 and the shooting control unit 303 are supported by the support member 304 and the support members 305.

Figure 7:
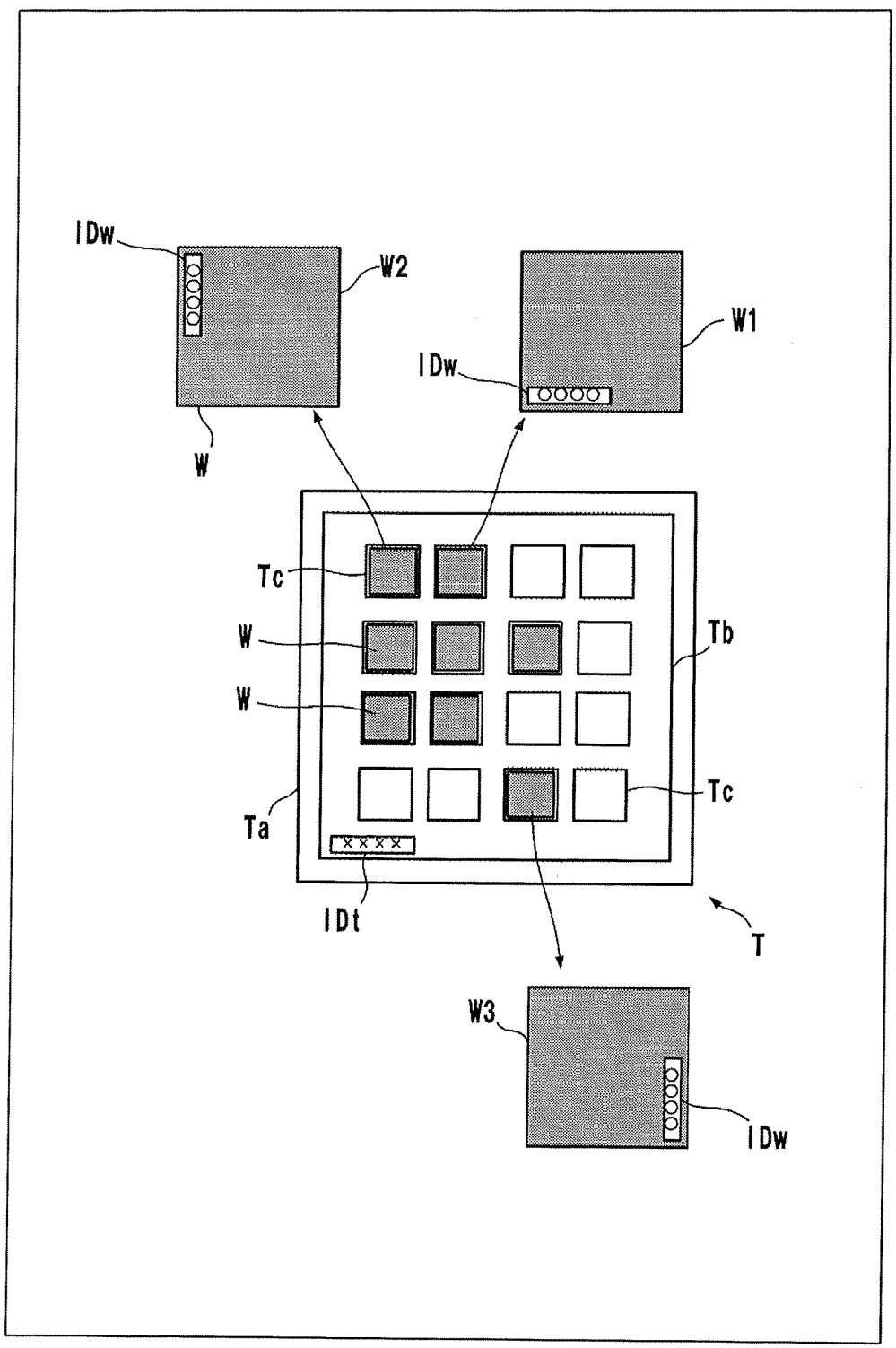
FIG. 7 is an explanatory view of identification marks added to the tray and works.
Figure 8:
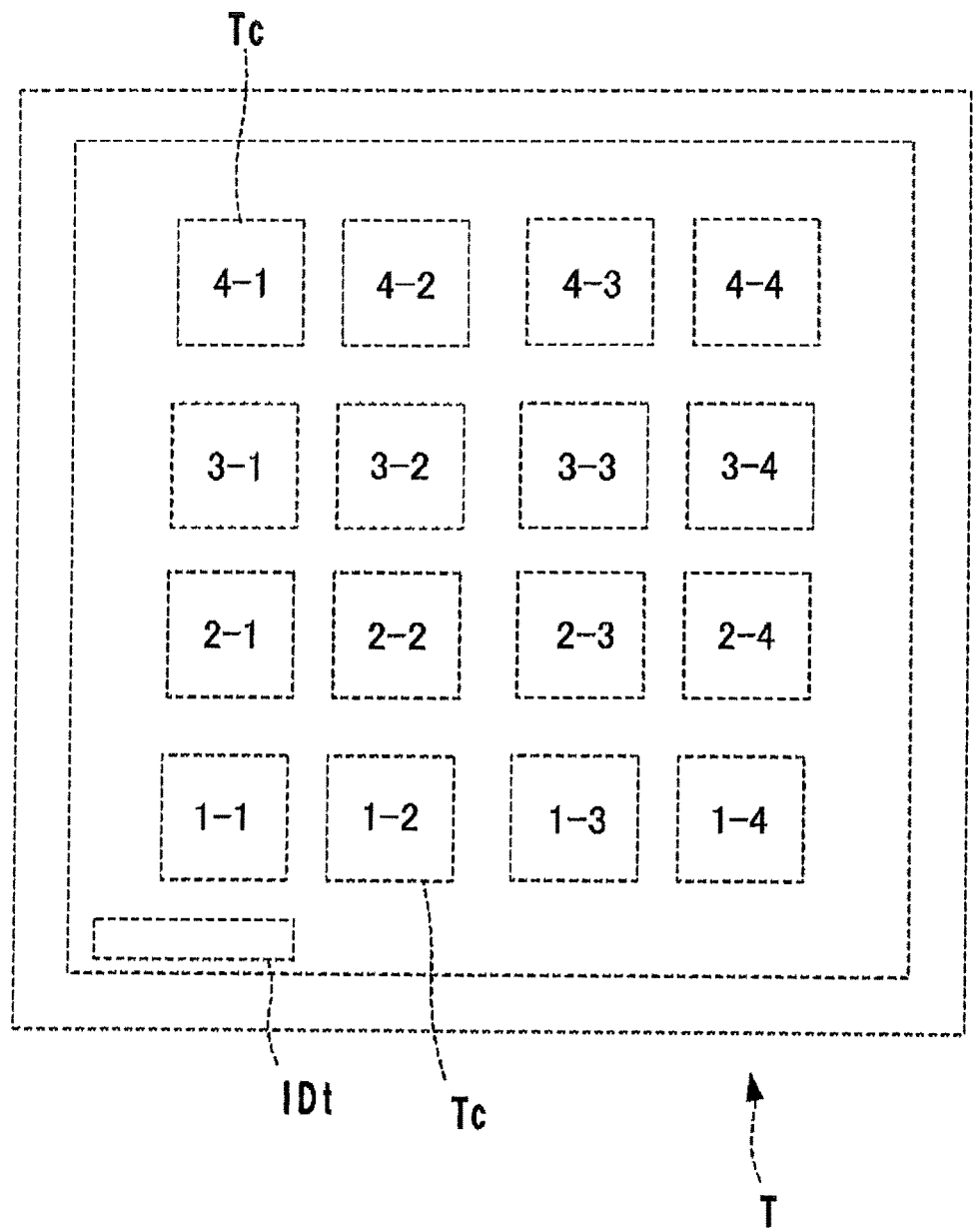
FIG. 8 is an explanatory view concerning an identification code of each work placement portion of the tray.

An example of a shot image of the tray T shot by the shooting unit 30 and an example of information generated from the shot image will be described here with reference to FIGS. 7 to 9. FIG. 7 is an explanatory view of identification marks IDt and IDw added to the tray T and works W.

The identification mark IDt is added to the tray T. The identification mark IDt includes tray information capable of identifying each tray T. The identification mark IDt can be either formed by a label or the like separated from the tray T or directly formed (for example, carved) in the tray T. When added to a specific position, the identification mark IDt can also serve as an identifier to determine the attitude (for example, direction) of the tray T. In this embodiment, the identification mark IDt is added to the surface of the stage portion Tb. The identifier used to determine the attitude of the tray T may be provided independently of the identification mark IDt. Note that the attitude of the tray T can also be determined by including an identifier representing a direction in the identification mark IDt.

In this embodiment, each work W has a square plate shape. In the example of FIG. 7, not all the work placement portions Tc contain the works W, and the works W are absent in some of the work placement portions Tc.

The identification mark IDw is added to each work W. The identification mark IDw includes work information capable of identifying each work W. The identification mark IDw can be either formed by a label or the like separated from the work W or directly formed (for example, carved) in the work W.

When added to a specific position, the identification mark IDw can also serve as an identifier to determine the attitude (for example, direction) of the work W. In this embodiment, the identification mark IDw is added to a corner of the surface of the work W so as to enable to identify a predetermined direction. For example, a work W1 is defined as a reference attitude, and its direction is expressed as 0°. The direction of a work W2 can be expressed as 90°, and the direction of a work W3 can be expressed as 270° (or −90°). The attitude of the work W needs to be identified when transporting the work W by sucking or gripping a predetermined portion of it or when placing the work W on the tray T while aligning its attitude. The identifier used to determine the attitude of the work W may be provided independently of the identification mark IDw. Alternatively, an arrangement that adds only the identifier used to determine the attitude of the work W is added to the work W may be employed. Note that the attitude of the work W can also be determined by including an identifier representing a direction in the identification mark IDw.

To manage the work W, it may be necessary to discriminate which work placement portion Tc contains the work W out of the plurality of work placement portions Tc of the tray T. To do this, each work placement portion Tc is assigned an identification code. FIG. 8 shows an example. In the example of FIG. 8, identification codes 1-1 to 4-4 are assigned to the 16 work placement portions Tc. It is possible to specify, by the identification code and the tray information represented by the identification mark IDt, which work placement portion Tc of the tray T contains a specific work W.

Figure 9:
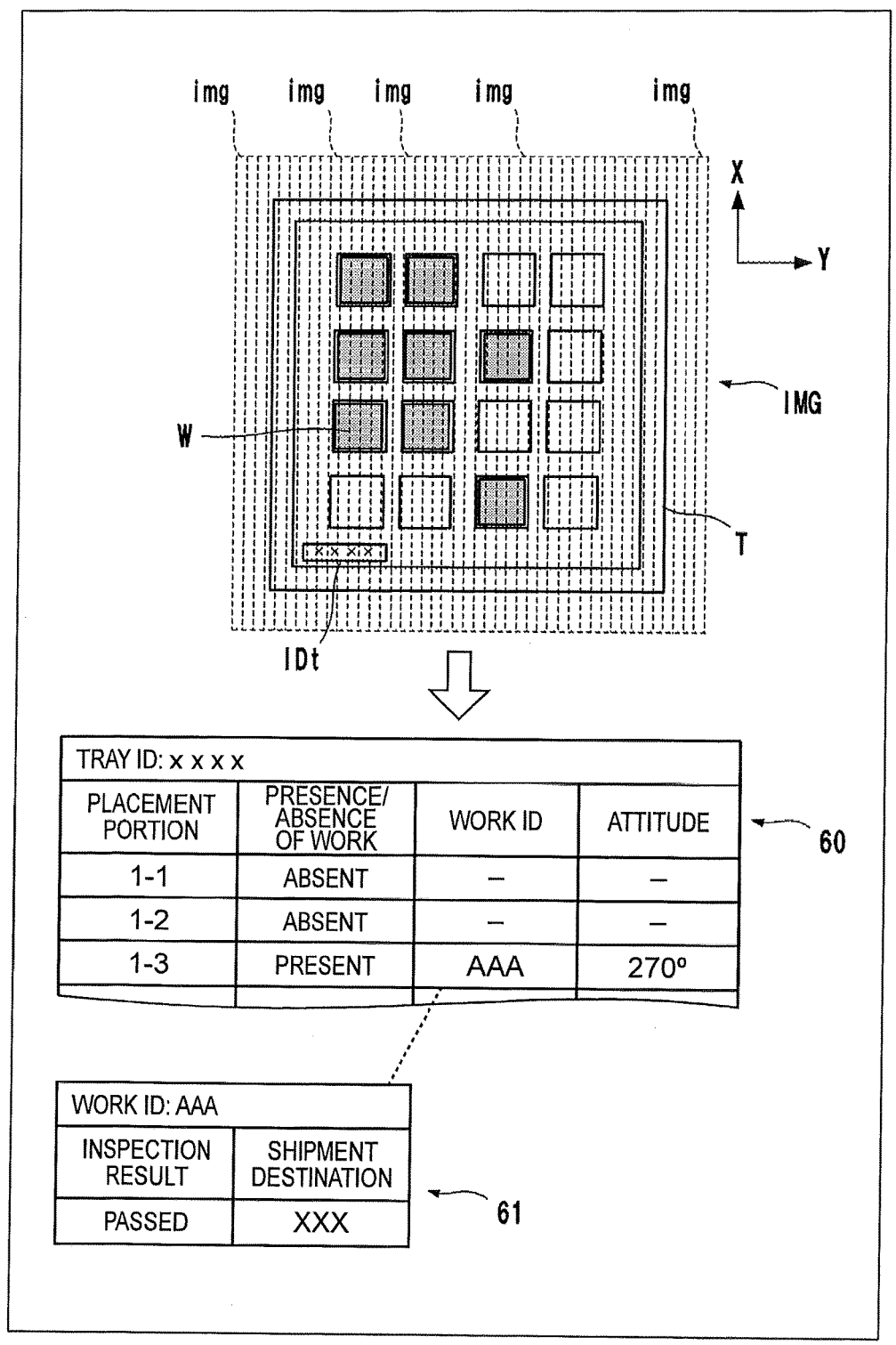
FIG. 9 is an explanatory view of image shooting of the tray and works, tray information, and work information.

FIG. 9 is an explanatory view of image shooting of the tray T and the works W, tray information, and work information. One shot image obtained by the line sensor 301 is a one-dimensional image long in the X direction, as described above. Shot images are composited into one image, thereby completing an overall image.

An overall image IMG shown in FIG. 9 indicates the concept, and is generated by a plurality of images (partial images) img obtained by causing the line sensor 301 to shoot one tray T. In this embodiment, assume a case where the shooting control unit 303 generates the overall image IMG. The partial image img is an image obtained by one shooting of the line sensor 301. When the shooting operation (for example, shooting interval) of the line sensor 301 is controlled based on the moving speed of the tray T, and shooting is continuously performed, the partial images img are obtained throughout the transport direction of the tray T.

First shooting by the line sensor 301 can be done, for example, after the elapse of a predetermined time from detection of the tray T by the tray detection sensor 15 of the transport apparatus 10. Final shooting can be done after the elapse of a predetermined time from the end of detection of the tray T by the tray detection sensor 16.

Note that the moving speed of the tray T can be obtained from the control amount of the driving sources 521 by the basic unit 50 or the detection result of the operation amount of the driving sources 521 obtained by the sensor.

The shooting control unit 303 also reads information from the identification mark IDt of the tray T added to the tray and the identification marks IDw of the works W added to the individual works for the overall image IMG of the tray T using a known image analysis technology. For example, characters (including symbols and the like) represented by the identification marks IDt and IDw are extracted from the images of the identification marks IDt and IDw, and character conversion processing of the extracted images is performed. Tray information and work information can thus be obtained as character information that can be processed on the computer. Then, based on the tray information of the tray T and the work information of the works W acquired by the shooting control unit 303 and the specification information of the tray accumulated in advance, the positions of the individual work placement portions Tc are recognized, and it is determined whether the work W is placed on each work placement portion Tc. Whether the work W is placed can be determined depending on whether the identification mark IDw exists within the contour of the work placement portion Tc.

For example, state information 60 of the tray T is generated by the image analysis result. The state information 60 is created for each tray T identified by the tray ID (tray information), and includes the presence/absence of the work W and a work ID (work information) for each work placement portion Tc. This information represents the works W placed on the tray T and their positions. In this embodiment, the state information 60 also includes information representing the attitude of each work W.

Note that work state information 61 is associated with each work W, which includes a detection result and information representing a shipment destination in the example of FIG. 9.

Referring back to FIG. 6, the moving device 31 moves the basic unit 50 and the shooting unit 30 in a direction (X direction) to cross the plurality of transport lines 10 of the first transport unit 1. In this embodiment, the moving device 31 includes a guide rail 311 and a moving element 312. The guide rail 311 extends in the X direction and is stationarily arranged on a platform (not shown) to guide the movement of the moving element 312. The moving element 312 is a plate-shaped member having a predetermined length and extending in the X direction as the moving direction, and engages with the guide rail 311 so as to be movable in the X direction. The moving element 312 is moved by a driving mechanism (not shown). As the driving mechanism, a known mechanism can be employed, which can be formed from, for example, a driving source such as a motor and a transmission mechanism (for example, a belt transmission mechanism, ball screw mechanism, or rack and pinion mechanism) configured to transmit the driving force of the driving source. In addition, when a sensor such as an encoder configured to detect the position of the moving element 312 is provided, the position of the moving element 312 can be controlled based on the detection result of the sensor.

The basic unit 50 is fixed to the moving element 312. Hence, when the moving element 312 moves, the basic unit 50 also moves. The support members 305 stand on the moving element 312. Hence, the shooting unit 30 is also fixed to the moving element 312. Hence, when the moving element 312 moves, the shooting unit 30 also moves together with the basic unit 50. For this reason, the moving element 312 that moves along the guide rail 311 stationarily placed on the platform (not shown) can stably move. Since the support member 304 and the pair of support members 305, which are arranged across the basic unit 50 in the X direction of the moving element 312, form a gate shape (arch shape) and are attached and fixed in parallel to the X direction as the moving direction, the strength particularly in the X direction can be improved, and the line sensor 301 formed on the support member 304 can stably shoot. Since the shooting unit 30 includes not only the line sensor 301 but also the illumination device 302, equipment necessary for shooting can be moved at once. In addition, when the illumination device 302 and the support members 306 are arranged midway through the pair of support members 305, and the pair of support members 305 are connected, the strength of the support structure formed from the support member 304 and the pair of support members 305 can be improved. The transport apparatuses 10 and the transport apparatuses 20 are arranged on the sides of the transfer unit 3 along the moving direction (X direction) of the moving element 312 so as to be located at positions continuous to the basic unit 50.

The work detection unit 32 detects the placement manner (for example, presence/absence of protrusion) of each work W on the tray T transferred by the basic unit 50. In this embodiment, the work detection unit 32 includes a sensor 321, a reflecting member 322, and an elevating unit 323 configured to move the sensor 321 up and down.

In this embodiment, the sensor 321 is a reflective photosensor, and includes a light-emitting element that emits light in the X direction, and a light-receiving element that receives reflected light from the reflecting member 322.

The sensor 321 is supported by one support member 305 via the elevating unit 323. The reflecting member 322 is supported by the other support member 305. The sensor 321 and the reflecting member 322 are arranged on the sides of the basic unit 50 in the X direction so as to face each other. The sensor 321 and the reflecting member 322 are arranged to detect the placement manner of each work W from a side of the tray T.

The elevating unit 323 adjusts the Z-direction position of the sensor 321 to a predetermined height in accordance with the type of the work W or the type of the tray T, and includes an actuator such as an electronic cylinder. The reflecting member 322 is fixed to the support member 305 but has a Z-direction length corresponding to the moving range of the sensor 321.

Figure 10:
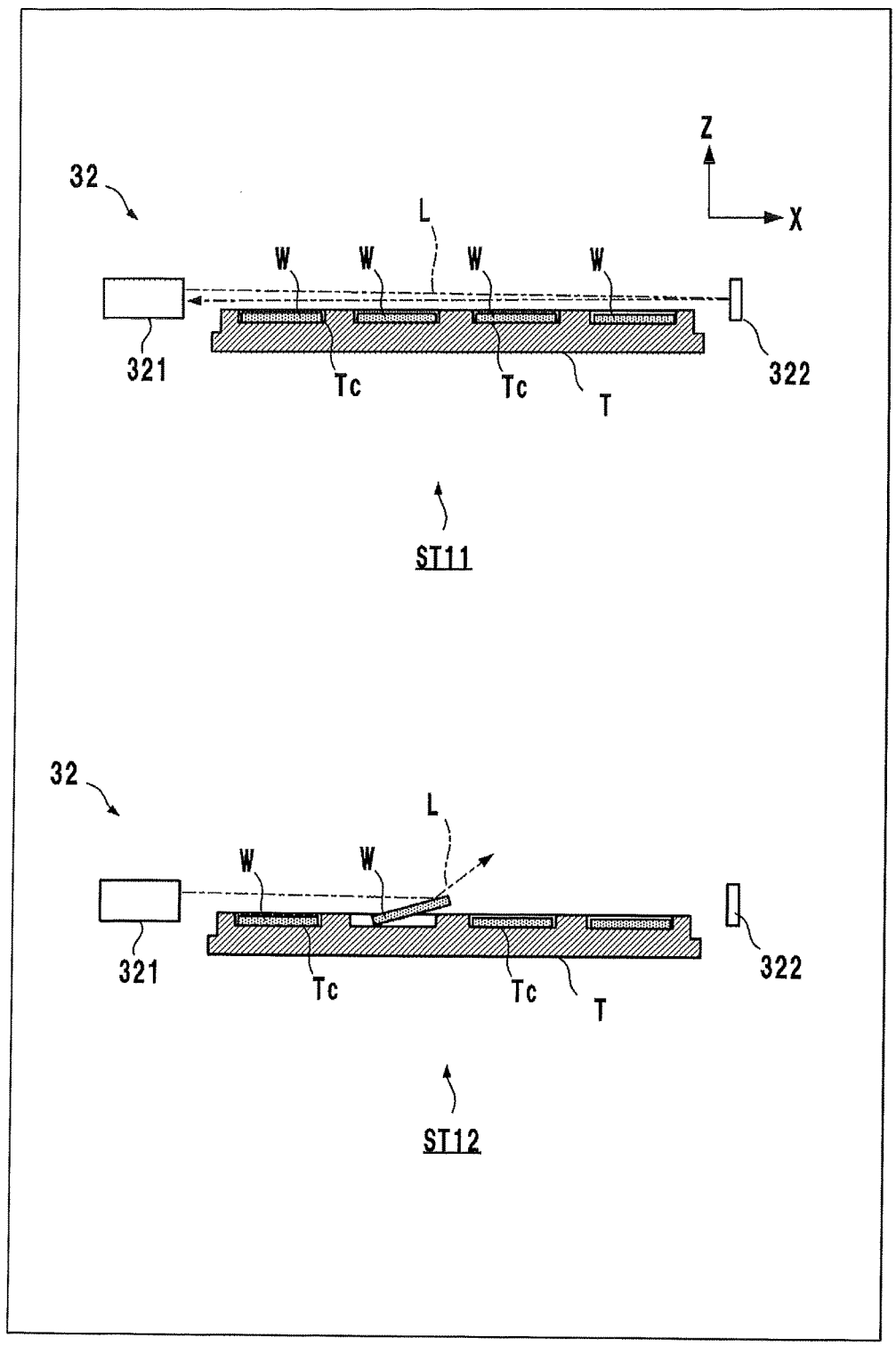
FIG. 10 is an explanatory view of the operation of a work detection unit.

FIG. 10 is an explanatory view of the operation of the work detection unit 32. The work detection unit 32 detects the placement manner of each work W to check the work W on the tray T transported by the basic unit 50 is placed on the work placement portion Tc in an appropriate attitude (horizontal attitude). In this embodiment, more specifically, the light irradiation/light receiving surface of the sensor 321 is set slightly above the upper surface (more specifically, a position calculated from the height information of the tray T, the work placement portion Tc, and the work W) of the tray T transported by the basic unit 50.

A state ST11 shows a case where all works W on the tray T are placed in an appropriate placement manner (horizontal attitude). In this case, light emitted by the sensor 321 reaches the reflecting member 322 and is reflected by the reflecting member 322 and received by the sensor 321.

A state ST12 shows a case where there exists a work W placed in an inappropriate placement manner (protrusion from the placement portion) among the works W on the tray T. Such a work W may fail in appropriately being held at the time of replacement. The light emitted by the sensor 321 interferes with the work W that is placed in the inappropriate placement manner and is not received by the sensor 321. The presence of the work W in the inappropriate placement manner can thus be detected.

In this embodiment, the work detection unit 32 is supported by the support members 305 and therefore moved by the moving device 31 together with the basic unit 50 and the shooting unit 30. Hence, transfer of the tray T, image shooting, and detection of work placement manner can be performed at once.

In this embodiment, the light irradiation direction is set to the X direction. However, the light irradiation direction may be set to any direction other than the X direction as long as the placement manner of the work W can be detected. A photosensor is used as the sensor 321. However, any other sensor is usable as long as the placement manner of the work W can be detected. The work detection unit 32 can be mounted on either the basic unit 50 or the moving element 312.

<Work Replacement Unit>

Figure 11:
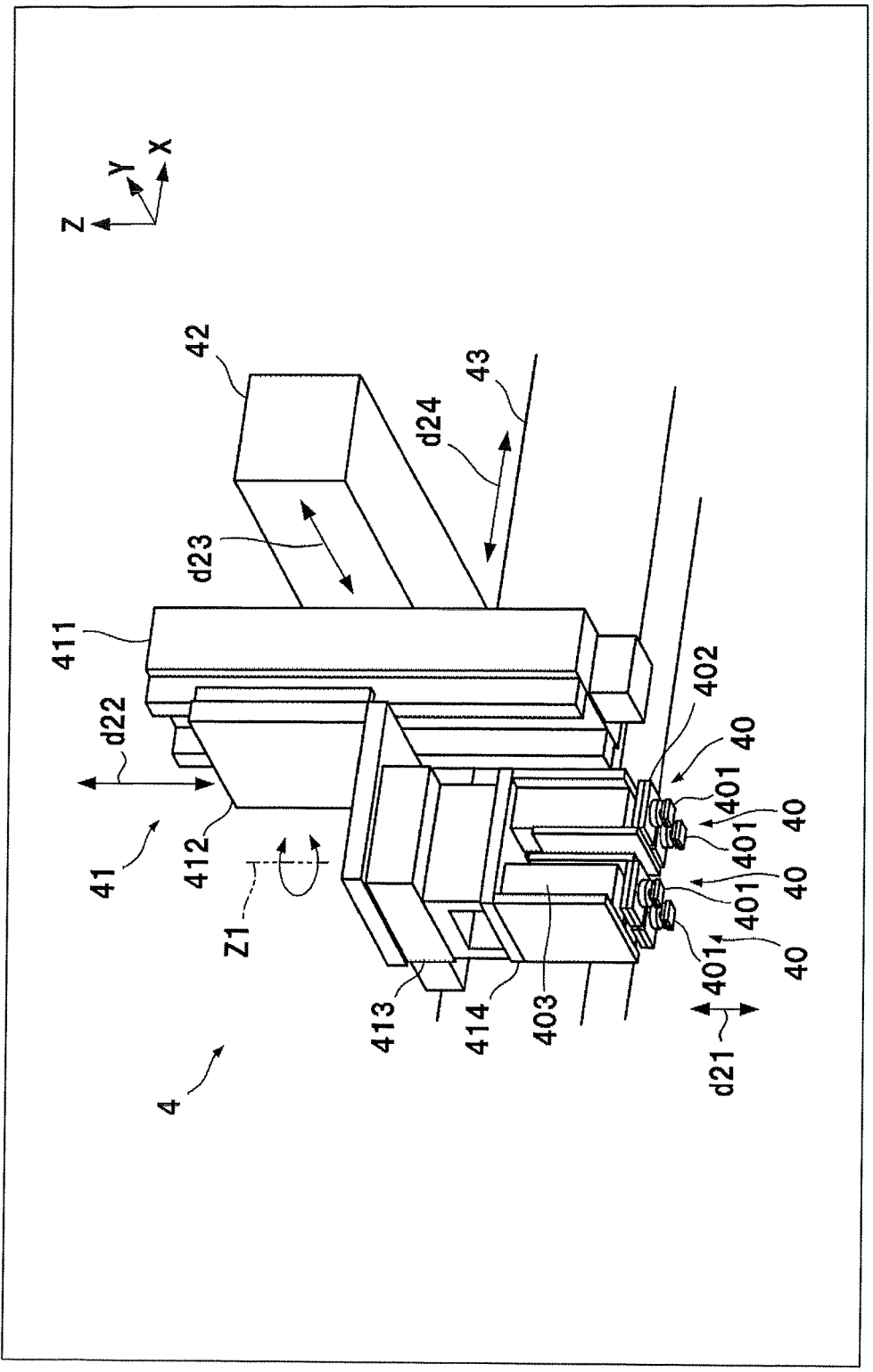
FIG. 11 is an explanatory view of a work replacement unit.

The work replacement unit 4 will be described next with reference to FIG. 11. In this embodiment, the work replacement unit 4 has a holding structure that sucks and holds the works W. However, another holding method, for example, a holding structure that grips and holds the works W may be employed. The work replacement unit 4 is arranged in the second transport unit 2, and includes a plurality of suction heads 40 configured to suck and hold works, an elevating/pivoting mechanism 41 configured to move the plurality of suction heads 40 in the vertical direction that is a Z direction d21 and make the plurality of suction heads 40 pivot about the elevating axis, a movable guide unit 42 configured to move the plurality of suction heads 40 in a Y direction d23, and a guide unit 43 configured to move the plurality of suction heads 40 among the plurality of transport apparatuses 20 juxtaposed in an X direction d24.

Each suction head 40 includes a suction nozzle 401, an attachment member 402, and an elevating mechanism 403 serving as a first moving mechanism. The elevating mechanism 403 is, for example, an air cylinder and moves the attachment member 402 up and down in the Z direction. The suction nozzle 401 is attached to the attachment member 402.

The attachment member 402 includes an air duct (not shown) communicating with the suction nozzle 401. The suction nozzle 401 is connected to a suction device (for example, a vacuum pump, a pipe, and the like) (not shown) via the attachment member 402 and sucks the work W.

The elevating/pivoting mechanism 41 includes a movable guide unit 411, a slider 412, a pivoting mechanism 413, and a support member 414 that supports the suction heads 40. The movable guide unit 411 serves as a slider that is guided by the movable guide unit 42 so as to be moveable in the Y direction d23, and also serves as a guide member that guides the movement of the slider 412 in the direction of an arrow d22 (Z direction).

The slider 412 includes an engaging portion that engages with the movable guide unit 411 and is guided by the movable guide unit 411 so as to be movable in the direction of the arrow d22 (Z direction). The pivoting mechanism 413 is fixed to the bottom face of the base plate portion of the slider 412. The pivoting mechanism 413 is formed from, for example, a motor and a reduction gear, and rotatably supports the support member 414. The pivoting mechanism 413 causes the support member 414 to pivot about a pivot center line Z1 parallel to the Z direction. When the support member 414 pivots, the suction heads 40 also pivot, and the attitudes of the works W sucked by the suction heads 40 (here, the directions of the works W on the horizontal plane) can be changed.

The elevating/pivoting mechanism 414 is a member that supports the suction heads 40. In this embodiment, four suction heads 40 are supported by the support member 414, and four works W can simultaneously be sucked.

The movable guide unit 42 serves as a slider that is guided by the guide unit 43 so as to be moveable in the direction of the arrow d24 (X direction), and also serves as a guide member that guides the movement of the movable guide unit 411 in the direction of the arrow d23 (Y direction). The guide unit 43 is arranged above the second transport unit 2 across the second transport unit 2, and disposed between columns (not shown).

Each of a first moving mechanism that moves the slider 412 on the movable guide unit 411, a second moving mechanism that moves the movable guide unit 411 on the movable guide unit 42, and a third moving mechanism that moves the movable guide unit 42 on the guide unit 43 can employ a known moving mechanism and can be formed from, for example, a driving source such as a motor and a transmission mechanism (for example, a belt transmission mechanism, ball screw mechanism, or rack and pinion mechanism) configured to transmit the driving force of the driving source. In addition, when a sensor such as an encoder configured to detect the position of each of the slider 412, the movable guide unit 411, and the movable guide unit 42 is provided, the positions of the suction heads 40 can be controlled based on the detection result of each sensor.

With this arrangement, in this embodiment, the suction heads 40 can be moved three-dimensionally above the second transport unit 2. When replacing the works W, the work replacement unit 4 operates, for example, in the following way.

To suck the works W, the second moving mechanism and the third moving mechanism move the suction heads 40 to an extraction position close to the works W. Next, the elevating mechanism 403 serving as the first moving mechanism moves the attachment members 402 and the suction nozzles 401 down, thereby causing the suction nozzles 401 to abut against the works W and suck them. After that, the elevating mechanism 403 moves the attachment members 402 and the suction nozzles 401 up to extract the works W from the work placement portions Tc of the replacement source. The second moving mechanism and the third moving mechanism move the suction heads 40 above a target position. To change the attitudes of the works W, the pivoting mechanism 413 is actuated to make the suction heads 40 pivot. The elevating mechanism 403 moves the attachment members 402 and the suction nozzles 401 down to seat the works W on the work placement portions Tc of the replacement destination, and cancels suction of the works W.

<Control Unit>

Figure 12:
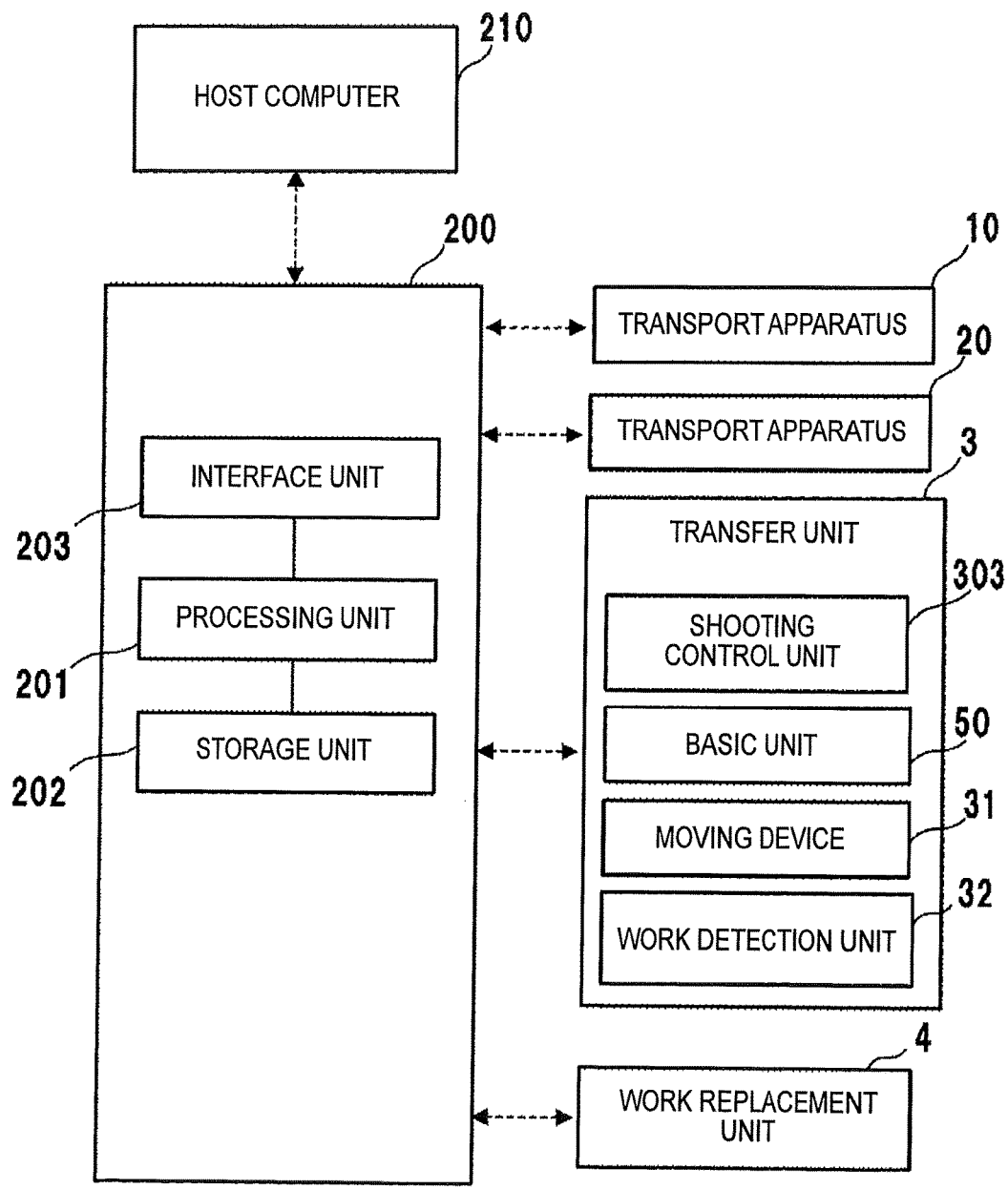
FIG. 12 is a block diagram of the control unit of the transport system shown in FIG. 1.

The control unit of the transport system A will be described next. FIG. 12 is a block diagram of a control unit 200 of the transport system A. The control unit 200 controls the entire transport system A in accordance with an instruction from a host computer 210.

The control unit 200 outputs control instructions to the transport apparatuses 10, the transport apparatuses 20, the transfer unit 3 (shooting control unit 303, basic unit 50, moving device 31, and work detection unit 32), and the work replacement unit 4 to control them.

The control unit 200 includes a processing unit 201, a storage unit 202, and an interface unit 203, which are connected to each other via a bus (not shown). The processing unit 201 executes a program stored in the storage unit 202. The processing unit 201 is, for example, a CPU. The storage unit 202 is, for example, a RAM, ROM, hard disk, or the like. The storage unit 202 can also store various kinds of information such as the state information 61 (FIG. 9) of the work W, and the state information 60 of the tray T (FIG. 9) generated by the shooting control unit 303. The interface unit 203 includes a communication interface that controls communication between the processing unit 201 and the host computer 210, and an I/O interface that controls data input/output between the processing unit 201 and an external device.

<Example of Transport Control>

Figure 13:
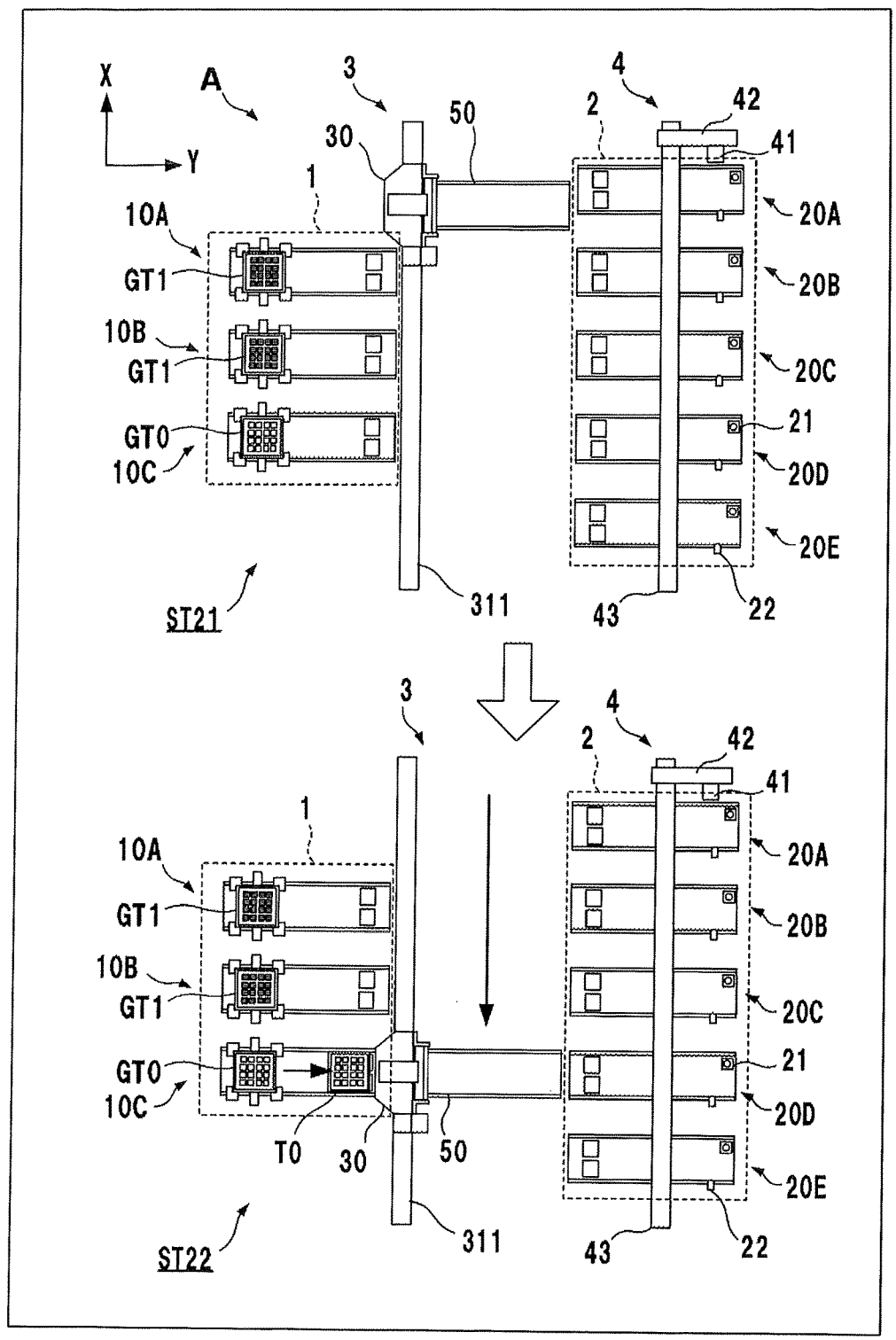
FIG. 13 is an explanatory view of an example of the operation of the transport system shown in FIG. 1.
Figure 14:
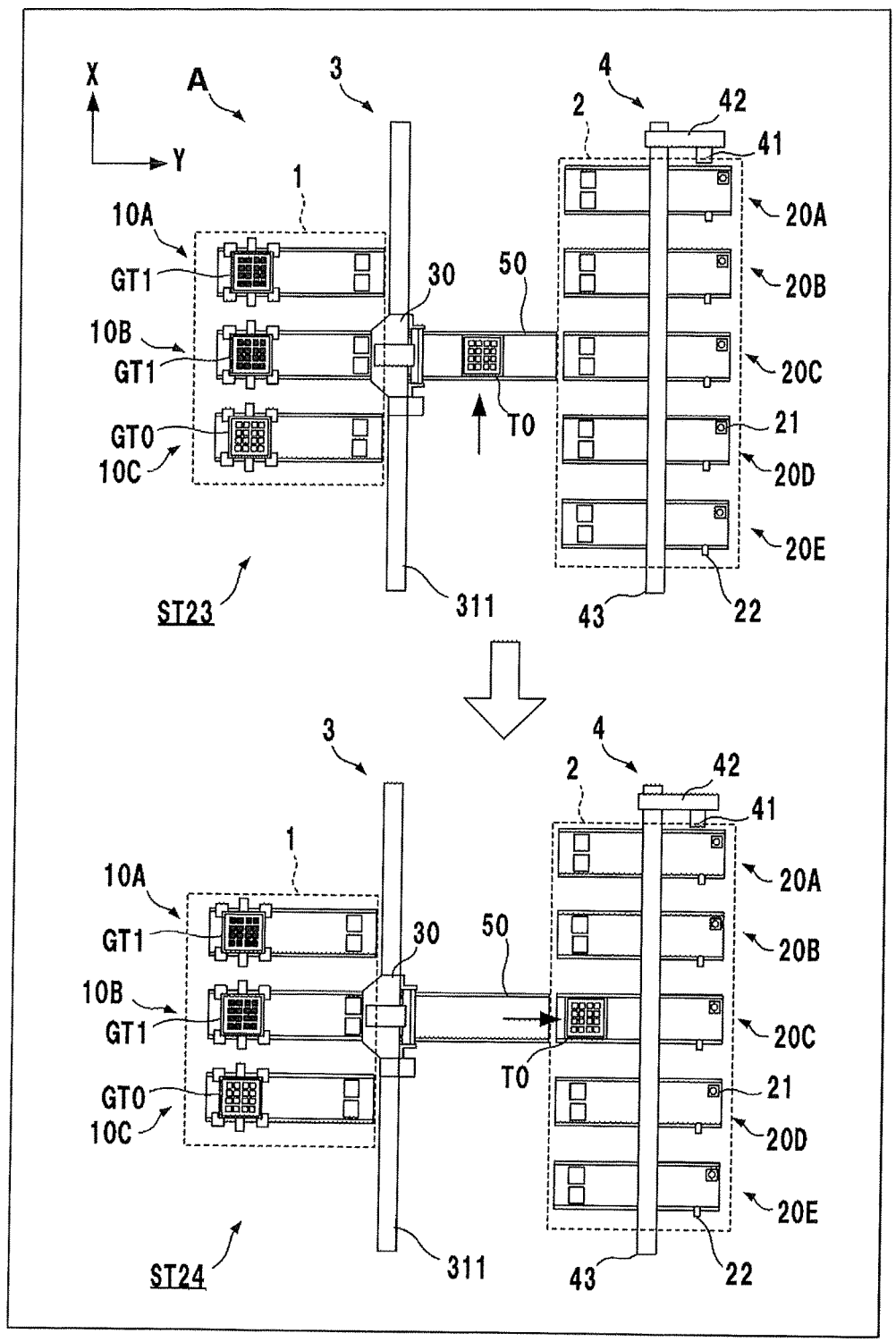
FIG. 14 is an explanatory view of an example of the operation of the transport system shown in FIG. 1.
Figure 15:
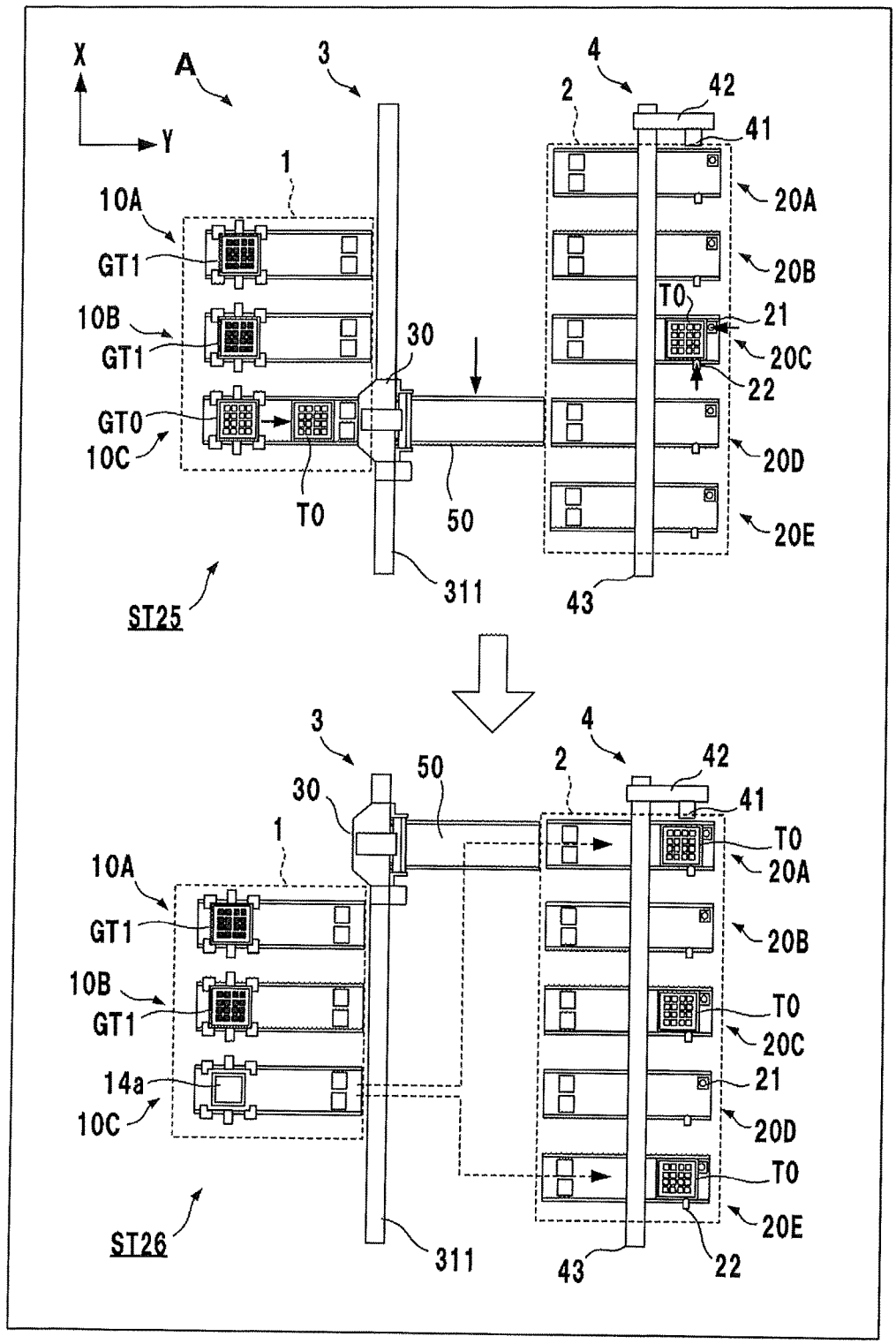
FIG. 15 is an explanatory view of an example of the operation of the transport system shown in FIG. 1.

An example of control of the transport system A by the control unit 200 will be described next with reference to FIGS. 13 to 19. FIGS. 13 to 19 are explanatory views of an example of the operation of the transport system A. The outline of an example of the operation will be described below. In this embodiment, assume a case where the works W are sorted in accordance with product inspection results. In the sorting operation according to this embodiment, first, an empty tray T as the replacement destination of the works W is supplied to the second transport unit 2 (FIGS. 13 to 15). Next, a tray T on which the works W before sorting are placed is supplied to the second transport unit 2 (FIGS. 16 to 19). Finally, the works W are replaced between the trays T on the second transport unit 2 (FIG. 19). This will sequentially be described below.

First, as indicated by a state ST21 shown in FIG. 13, an initial state is prepared. More specifically, tray groups GT1 each including the stacked trays T with the works W before sorting are set in the transport apparatuses 10A and 10B. Specifically speaking, each tray group GT1 is placed on the elevating table 14a inside the tray guides 12. On the other hand, a tray group GT0 including a necessary number of (here, three) stacked empty trays T is set in the transport apparatus 10C. None of the transport apparatuses 20 has the tray T.

Next, the empty trays T of the tray group GT0 are supplied to the second transport unit 2. The empty trays T are transported to the transport apparatuses 20A, 20C, and 20E one by one. First, the moving element 312 of the transfer unit 3 is moved, and the basic unit 50 of the transfer unit 3 is arranged continuously to the transport apparatus 10C to form a transport path, as indicated by a state ST22 shown in FIG. 13. The transport apparatus 10C is driven to "destack" one empty tray T0 from the tray group GT0 and transport it to the basic unit 50 of the transfer unit 3. During the process of transporting the tray T0 from the transport apparatus 10C to the basic unit 50, the shooting unit 30 shoots the tray T0. When the empty tray T0 is received by the basic unit 50, the moving element 312 of the transfer unit 3 is moved, and the basic unit 50 of the transfer unit 3 is arranged continuously to the transport apparatus 20C as the replacement destination of the tray T0 to form a transport path, as indicated by a state ST23 shown in FIG. 14. During the process after the tray T0 is received by the basic unit 50 until the basic unit 50 is arranged continuously to the transport apparatus 20C, the shooting control unit 303 generates an overall image and creates the state information of the tray T0 and transmits the created state information to the control unit 200. In the state information of the tray T0, no works W are placed on the tray T0 at all as a matter of course.

Next, the tray T0 is transported from the basic unit 50 of the transfer unit 3 to the transport apparatus 20C, as indicated by a state ST24 shown in FIG. 14. The transport apparatus 20C transports the tray T0 from one end side continuous to the basic unit 50 to the other end side, causes the positioning mechanisms 21 and 22 formed on the other end side to position the tray T0, and then transits to a standby state while keeping the tray T0 positioned, as indicated by a state ST25 shown in FIG. 15. The control unit 200 generates information representing that the tray T0 exists on the transport apparatus 20C as the location information of the tray T0 in the second transport unit 2 and associates it with the state information of the tray T0.

Parallelly, the transfer unit 3 moves the moving element 312 and arranges the basic unit 50 of the transfer unit 3 continuously to the transport apparatus 10C to form a transport path to transport the next empty tray T0. The transport apparatus 10C is driven to "destack" one empty tray T0 from the tray group GT0 and transport it to the basic unit 50 of the transfer unit 3. In a similar manner, the empty trays T0 are transported to the transport apparatuses 20A and 20E, and a standby state is obtained, as indicated by a state ST26 shown in FIG. 15. The control unit 200 associates the location information of each tray T0 in the second transport unit 2 with the state information of the tray T0.

Transport of the empty trays T0 is thus completed. In the transport apparatus 10C, no empty tray T0 remains at all. In this embodiment, the transport apparatus 10C is used next as an apparatus for collecting abnormal trays T. In this embodiment, the empty trays T0 in the standby state on the transport apparatuses 20A and 20E are used as trays (non-defective trays) to place normal works W that have passed inspection. On the other hand, the empty tray T0 in the standby state on the transport apparatus 20C is used as a tray (defective tray) to place works W that have not passed inspection.

An operation of supplying the tray T with the works W before sorting to the second transport unit 2 will be described next. This operation is basically the same as the transport of the empty tray T0. However, since the work detection unit 32 detects the placement manners of the works W, the elevating unit 323 is driven and controlled in advance so as to locate the sensor 321 at a predetermined height.

Figure 16:
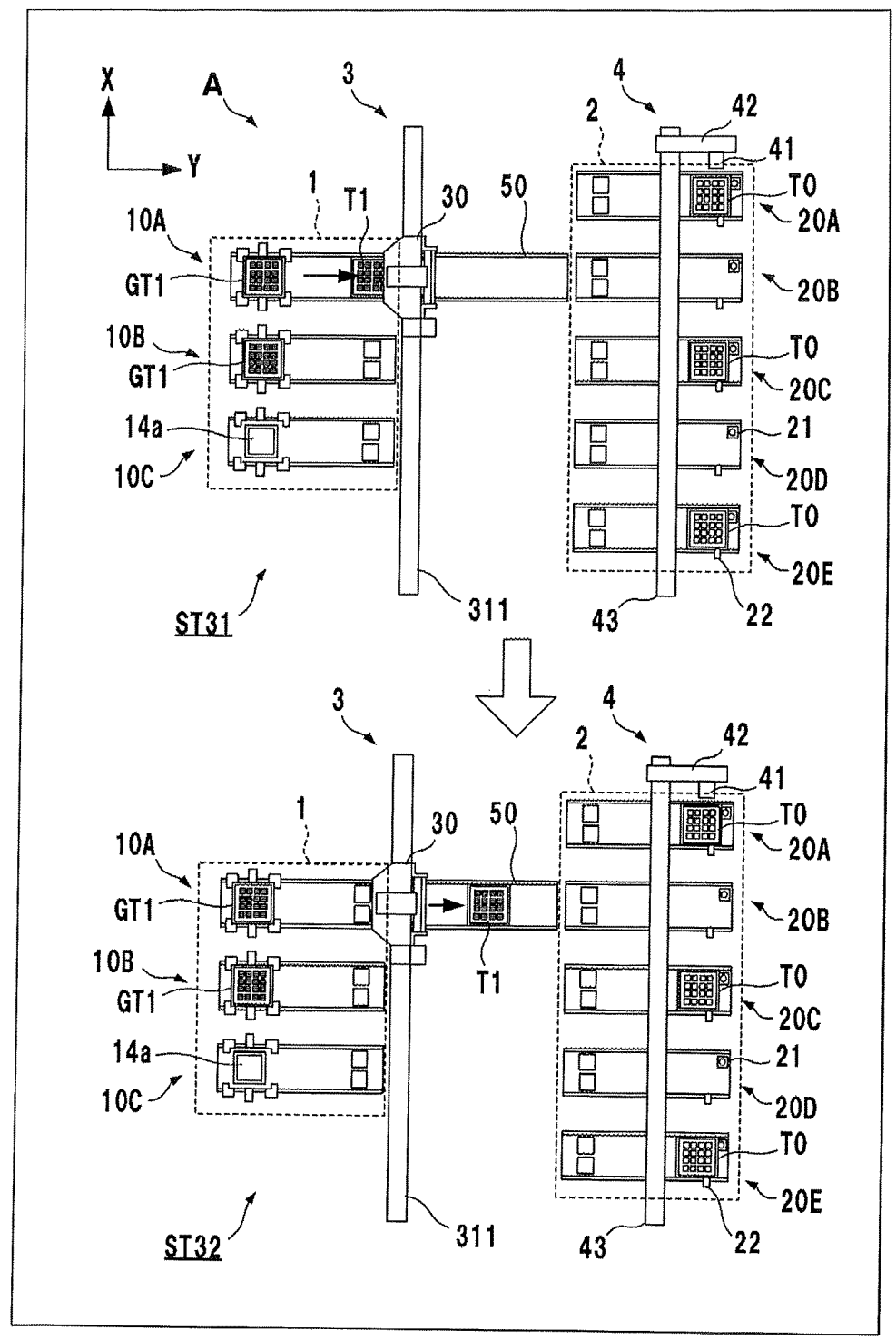
FIG. 16 is an explanatory view of an example of the operation of the transport system shown in FIG. 1.

First, the moving element 312 of the transfer unit 3 is moved to arrange the basic unit 50 of the transfer unit 3 continuously to the transport apparatus 10A to form a transport path, as indicated by a state ST31 shown in FIG. 16. The transport apparatus 10B may be used in place of the transport apparatus 10A. The transport apparatus 10A is driven to "destack" one tray T1 with the works W before sorting from the tray group GT1 and transport it to the basic unit 50 of the transfer unit 3, and the basic unit 50 receives it, as indicated by a state ST32.

During the process of transporting the tray T1 from the transport apparatus 10A to the basic unit 50, the shooting unit 30 shoots the tray T1, and at the same time, the work detection unit 32 detects the placement states of the works W on the tray T1. The shooting control unit 303 generates an overall image and creates the state information of the tray T0 and transmits the created state information to the control unit 200. The control unit 200 acquires the detection result of the work detection unit 32.

Figure 17:
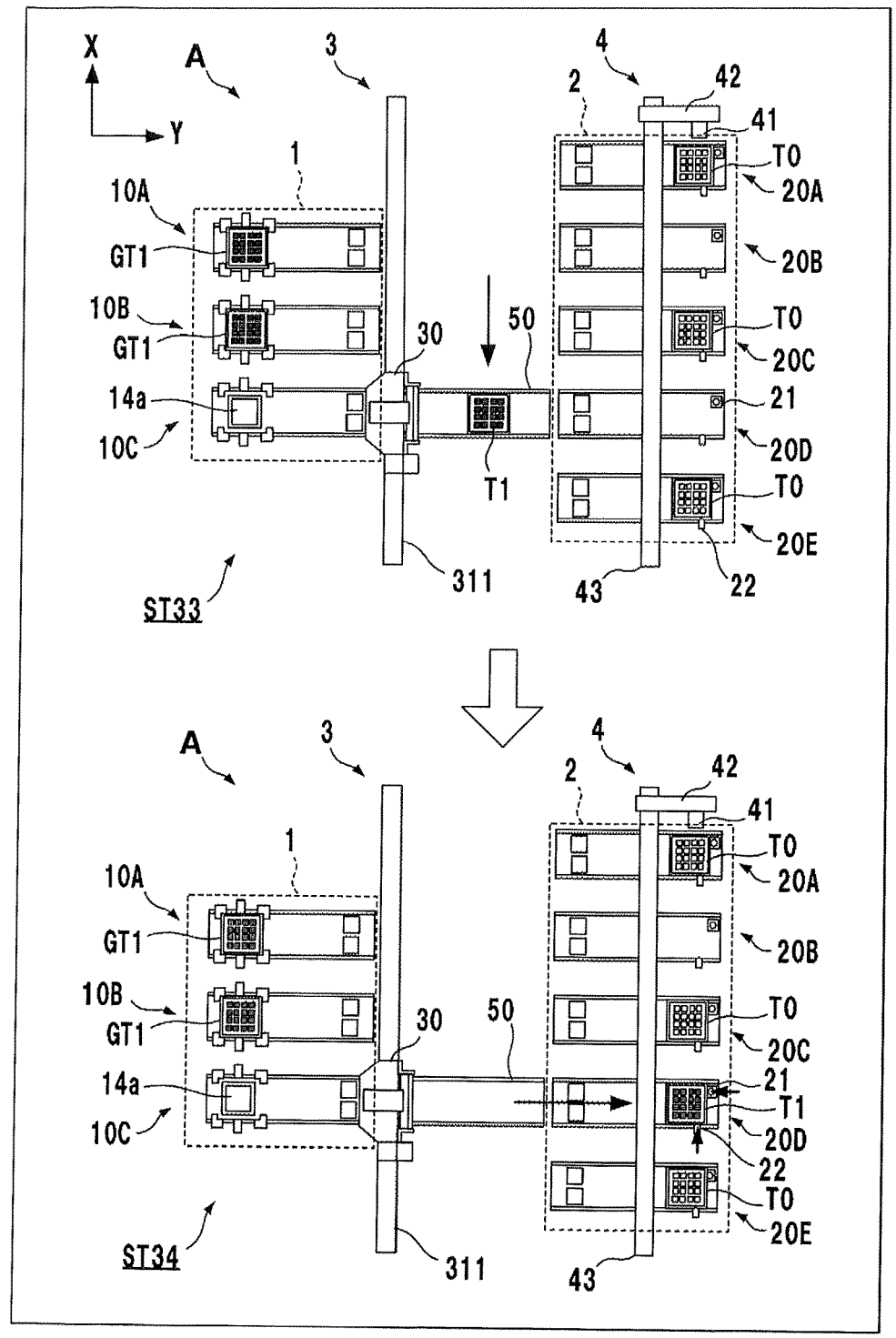
FIG. 17 is an explanatory view of an example of the operation of the transport system shown in FIG. 1.

If the placement states of the works W have no abnormality, the moving element 312 of the transfer unit 3 is moved to arrange the basic unit 50 of the transfer unit 3 continuously to the transport apparatus 20D as the transport destination of the tray T1 to form a transport path, as indicated by a state ST33 shown in FIG. 17.

Next, the tray T1 is transported from the basic unit 50 of the transfer unit 3 to the transport apparatus 20D, as indicated by a state ST34 shown in FIG. 17. The transport apparatus 20D transports the tray T1 from one end side to the other end side, causes the positioning mechanisms 21 and 22 formed on the other end side to position the tray T1, and then transits to the standby state while keeping the tray T1 positioned. The control unit 200 associates the location information of the tray T1 in the second transport unit 2 with the state information of the tray T1.

Figure 18:
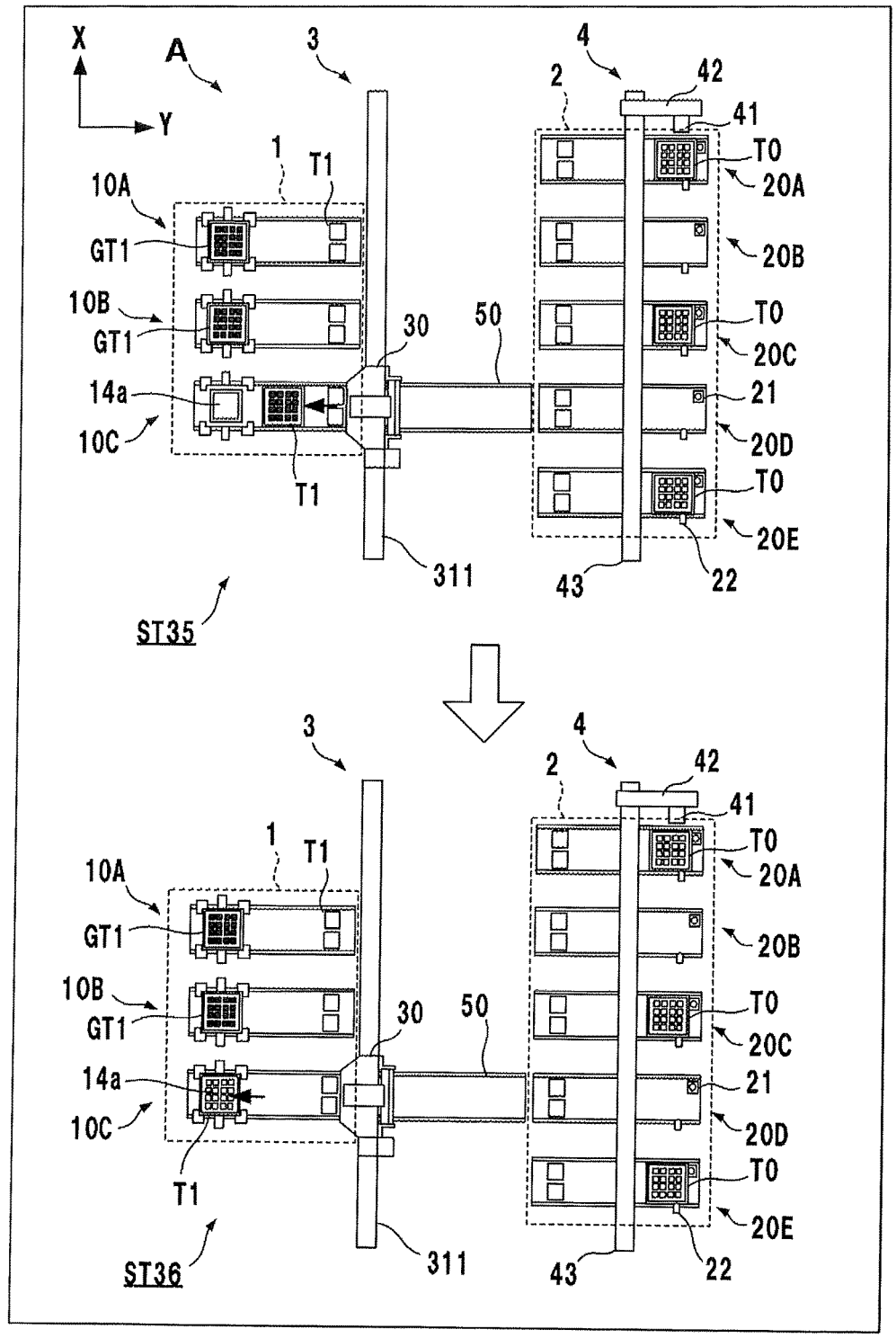
FIG. 18 is an explanatory view of an example of the operation of the transport system shown in FIG. 1.
Figure 19:
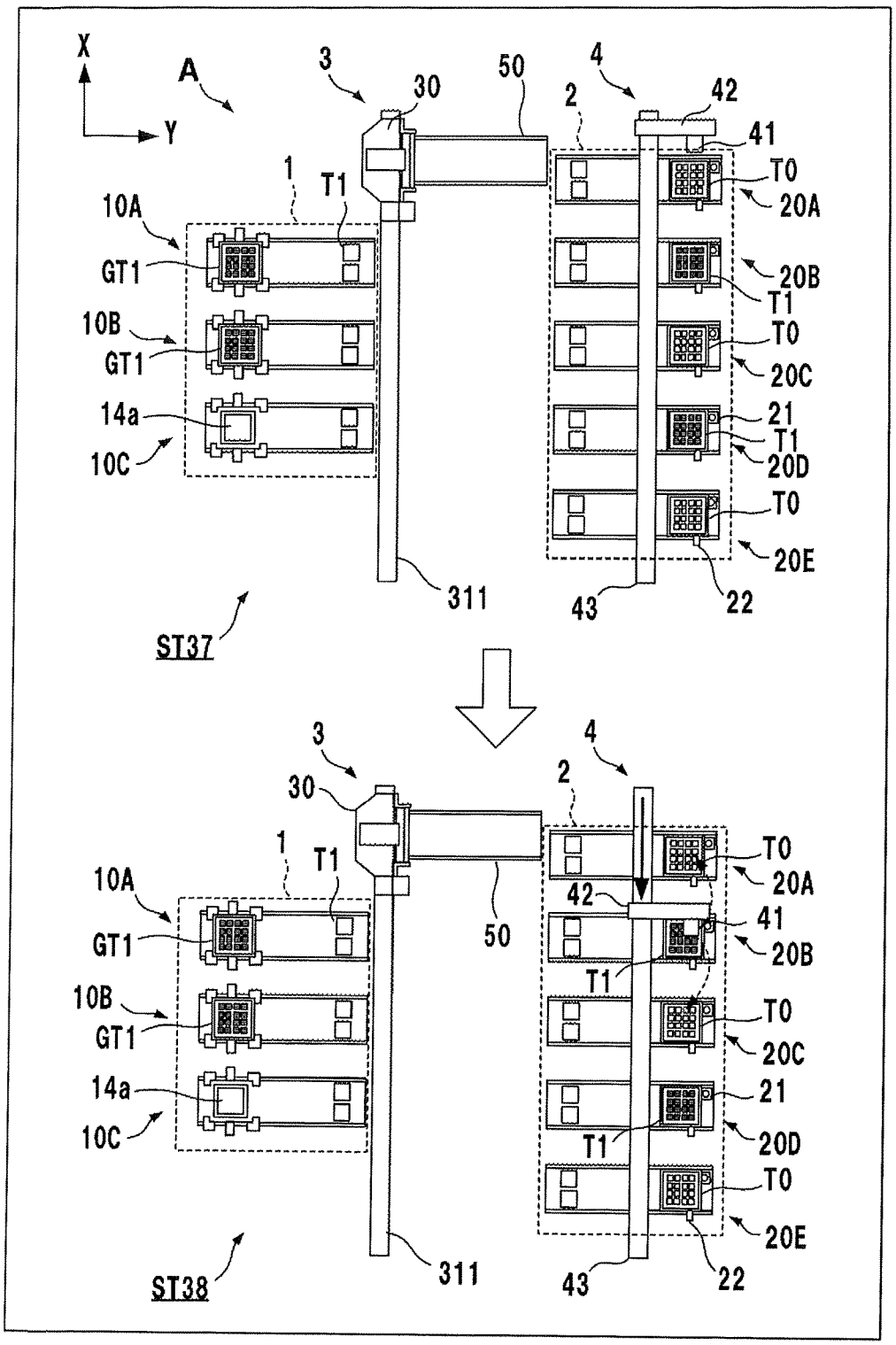
FIG. 19 is an explanatory view of an example of the operation of the transport system shown in FIG. 1.

On the other hand, if an abnormality is detected in the placement states of the works W, the moving element 312 of the transfer unit 3 is moved to arrange the basic unit 50 of the transfer unit 3 continuously to the transport apparatus 10C serving as the abnormal tray collection destination to form a transport path, as indicated by a state ST35 shown in FIG. 18, and the tray T1 is transported from the basic unit 50 of the transfer unit 3 to the transport apparatus 10C.

Upon receiving the tray T1, the transport apparatus 10C temporarily stops transport of the tray T1 halfway through, outputs a warning, and causes the worker to confirm the abnormality. When the worker confirms the abnormality, and recovery from the abnormality is done, transport of the tray T1 to the transfer unit 3, shooting, and detection of the placement states of the works W are sequentially performed again in accordance with a recovery completion instruction from the worker. If the placement states of the works W have no abnormality as the result of redetection, the tray T1 is transported to the transport apparatus 20D as the transport destination, as described concerning the states ST33 and ST34 shown in FIG. 17.

If recovery from the abnormality is impossible, transport of the tray T1 by the transport apparatus 10C is resumed in accordance with a recovery abandonment instruction from the worker, and the tray T1 is placed on the elevating table 14a of the transport apparatus 10C, as indicated by a state ST36 shown in FIG. 18. From then on, if an abnormal tray T1 has similarly occurred, it is sequentially stacked on the elevating table 14a. The worker may immediately extract the abnormal tray T1 from the transport apparatus 10C.

In a similar way, the tray T1 with the works W before sorting is transported to the transport apparatus 20B as well, and a standby state is obtained, as indicated by a state ST37 shown in FIG. 19. The control unit 200 associates the location information of the tray T1 with the state information of the tray T1.

Transport of the trays T1 with the works W before sorting is thus completed. As a result, on the transport apparatuses 20A, 20C, and 20E, the empty trays T0 are set in the standby state while being positioned. On the transport apparatuses 20B and 20D, the trays T1 with the works W before sorting are set in the standby state while being positioned.

Next, the sorting operation of the works W is performed. Here, the works W are replaced (transferred) between the trays T that stand by at different positions of the second transport unit 2 based on the state information of the trays T0 and T1 and the state information of each work W. the replacement is done by driving the work replacement unit 4, as indicated by a state ST38 shown in FIG. 19.

Here, the works W that have passed inspection are replaced between the trays T1 and the trays T0. The trays T0 of the replacement destination are assumed to the trays T0 on the transport apparatuses 20A and 20E. The tray T0 on the transport apparatus 20C replaces the rejected works W.

Which work W is placed at which position on the tray T1 can be specified by referring to the state information of the tray. Whether the specified work has passed inspection can be confirmed by referring to the state information of the work. When the works W are replaced, the state information of the tray T1 of the replacement source is updated, and the state information of the tray T0 of the replacement destination is also updated. The works W are sequentially replaced on empty work placement portions Tc of the tray T0.

As described above, in the transport system A, the shooting unit 30 and the moving device (basic unit 50) are moved in the X direction. This obviates the necessity of preparing the shooting unit 30 for each of the plurality of transport lines and enables shooting of the tray T while suppressing an increase in cost. It is also possible to simultaneously transport and shoot the tray T and suppress a decrease in transport efficiency. In addition, since the shot image can be processed halfway through transfer of the tray T, the decrease in transport efficiency can further be suppressed.

Since the shooting unit 30 employs not an area sensor but the line sensor 301, clearer image information can be collected while suppressing an increase in cost. Additionally, since the tray T is continuously shot using its movement at the time of transfer to generate an overall image, the tray T need not be moved only for the purpose of shooting. This suppresses a decrease in transport efficiency.

In addition, the state information 60 of the tray T shown in FIG. 9 is generated and linked to the state information 61 of the works W shown in FIG. 9, thereby improving the manageability (traceability) of the works W.

Note that although a detection result is used as the sorting criterion of the works W in this embodiment, any other condition such as a shipment destination may be used as the criterion.

Other Embodiments

In the above embodiment, an example in which the transport system A is used to sort the works W has been described. However, the present invention is not limited to this. That is, the present invention is not limited to the above embodiment, and various changes and modifications can be made within the spirit and scope of the present invention. Therefore, to apprise the public of the scope of the present invention, the following claims are made.

What is claimed is:

1. A transport system that transports a tray in a horizontal attitude, the tray including a plurality of work placement portions arranged in a matrix on which works are placed, the system comprising:

a plurality of first transport line mechanisms configured to convey the tray in a first direction and arranged parallel with each other in a second direction orthogonal to the first direction, each of the plurality of first transport line mechanisms extend in the first direction, having a first transport start end and a first transport terminal end and including a motor as a driving source, a guide member for guiding movement of the tray in the first direction and a base member supporting the motor and the guide member;

at least one second transport line mechanism configured to convey the tray in the first direction, the at least one second transport line mechanism extends in the first direction, the at least one second transport line mechanism having a second transport start end and a second transport terminal end and including a motor as a driving source, a guide member for guiding movement of the tray in the first direction and a base member supporting the motor and the guide member of the second transport line mechanism;

a moving element configured to move along a rail extending in the second direction in a space between the first transport terminal end and the second transport start end;

a third transport line mechanism configured to be mounted on said moving element, the third transport line mechanism extending in the first direction and configured to transport the tray in the first direction from one of said plurality of first transport line mechanisms to said at least one second transport line mechanism, the third transport line mechanism including a motor as a driving source, a guide member for guiding movement of the tray in the first direction and a base member supporting the motor and the guide member of the third transport line mechanism;

a line sensor configured to be mounted on said moving element and shoot a one-dimensional image, long in a direction perpendicular to a transferring direction, of the tray; and an image generator configured to generate an overall image of the tray based on a plurality of partial images shot by said line sensor concerning one tray, wherein the tray includes tray information capable of identifying each tray, the work includes work information capable of identifying each work and a work identifier configured to identify an attitude of each work, and the system comprises an information generator configured to generate information representing the tray, the work placed on the tray, and a position of the work based on the tray information, the work information and the attitude of work based on the work identifier obtained from the overall image of the tray generated by said image generator.

2. A transport system that transports a tray in a horizontal attitude, the tray including a plurality of work placement portions arranged in a matrix on which works are placed, the system comprising:

a plurality of first transport line mechanisms configured to convey the tray in a first direction and arranged parallel with each other in a second direction orthogonal to the first direction, each of the plurality of first transport line mechanisms extend in the first direction, having a first transport start end and a first transport terminal end and including a motor as a driving source, a guide member for guiding movement of the tray in the first direction and a base member supporting the motor and the guide member;

at least one second transport line mechanism configured to convey the tray in the first direction, the at least one second transport line mechanism extends in the first direction, the at least one second transport line mechanism having a second transport start end and a second transport terminal end and including a motor as a driving source, a guide member for guiding movement of the tray in the first direction and a base member supporting the motor and the guide member of the second transport line mechanism;

a moving element configured to move along a rail extending in the second direction in a space between the first transport terminal end and the second transport start end;

a third transport line mechanism configured to be mounted on said moving element, the third transport line mechanism extending in the first direction and configured to transport the tray in the first direction from one of said plurality of first transport line mechanisms to said at least one second transport line mechanism, the third transport line mechanism including a motor as a driving source, a guide member for guiding movement of the tray in the first direction and a base member supporting the motor and the guide member of the third transport line mechanism;

a line sensor configured to be mounted on said moving element and shoot a one-dimensional image, long in a direction perpendicular to a transferring direction, of the tray; and an image generator configured to generate an overall image of the tray based on a plurality of partial images shot by said line sensor concerning one tray, wherein the work includes an identifier configured to identify each work and an attitude of each work, the tray includes tray information capable of identifying each tray, and the system comprises an information generator configured to generate information representing the tray, the work placed on the tray, and a position of the work based on the tray information, the work and the attitude of work based on the identifier obtained from the overall image of the tray generated by said image generator.

3. The transport system according to claim 2, comprising:
a work detection sensor configured to detect a placement manner of the work on the tray transferred by said third transport line mechanism,
wherein said work detection sensor is moved by said moving element together with said third transport line mechanism and said line sensor.

4. The transport system according to claim 3, wherein said work detection sensor is arranged to detect the placement manner of the work from a side of the tray, and
the system comprising:
an elevator configured to move said work detection sensor up and down; and
a drive controller configured to control said elevator so as to locate said work detection sensor at a predetermined height.

5. The transport system according to claim 2, comprising:
a sensor configured to detect a transferring speed of the tray transferred by said third transport line mechanism; and
a shooting controller configured to control a shooting interval of said line sensor in accordance with the transferring speed of the tray detected by said sensor.

6. The transport system according to claim 2, wherein said moving element includes:
a first fixing portion to which said third transport line mechanism is fixed; and
a second fixing portion to which said line sensor is fixed.

7. The transport system according to claim 6, comprising:
an illuminator configured to illuminate the tray to be shot; and
a support configured to support said line sensor and said illuminator,
said support being fixed to said moving element, and
wherein said illuminator is pivotably supported by said support.

8. The transport system according to claim 2, wherein said line sensor shoots the image of the tray during a process of transporting the tray from one of said plurality of first transport line mechanisms to the transport line to said third transport line mechanism.

9. The transport system according to claim 2, wherein said moving element moves said third transport line mechanism to a first location where said third transport mechanism is continuous with one of said first transport mechanisms and to a second location where said third transport mechanism is continuous with said second transport mechanism.

10. The transport system according to claim 2, comprising:
a work replacement unit configured to replace the work between different trays standing by in said second transporter based on the information generated by said information generator.

11. The transport system according to claim 2, wherein each of the identifier and the tray information includes characters, and
the information generator extracts images of the characters from the overall image of the tray and perform a character conversion processing of the extracted images.

12. The transport system according to claim 2, wherein the information generator generate the information based no predetermined specification information of the tray.

* * * * *